(12) United States Patent
Dearborn et al.

(10) Patent No.: US 11,356,019 B2
(45) Date of Patent: Jun. 7, 2022

(54) METHOD, SYSTEM AND APPARATUS FOR CONSTANT, HIGH SWITCHING FREQUENCY AND NARROW DUTY RATIO PWM CONTROL OF DC-DC CONVERTERS AND ACCURATE PFM CONTROL AT LIGHT LOAD

(71) Applicant: Microchip Technology Incorporated, Chandler, AZ (US)

(72) Inventors: Scott Dearborn, Brackney, PA (US); Jiong Ou, Baden Wuerttemberg (DE)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/145,944

(22) Filed: Jan. 11, 2021

(65) Prior Publication Data

US 2022/0021305 A1    Jan. 20, 2022

Related U.S. Application Data

(60) Provisional application No. 63/052,525, filed on Jul. 16, 2020.

(51) Int. Cl.
*H02M 3/157* (2006.01)
*G05F 1/56* (2006.01)
(Continued)

(52) U.S. Cl.
CPC ............ *H02M 3/157* (2013.01); *G05F 1/561* (2013.01); *H03K 3/037* (2013.01); *H02M 1/0025* (2021.05); *H02M 1/0041* (2021.05)

(58) Field of Classification Search
CPC ............ H02M 1/0003; H02M 1/0009; H02M 1/0025; H02M 1/0041; H02M 3/156;
(Continued)

(56) References Cited

U.S. PATENT DOCUMENTS 10,367,417 B1 * 7/2019 Yazdi ................... H02M 3/158
2005/0140415 A1 * 6/2005 Hazucha ............... H03K 5/135
327/276
(Continued)

FOREIGN PATENT DOCUMENTS

WO    2008/049044 A2    4/2008    ............ H02M 3/335

OTHER PUBLICATIONS

Lan, Po-Hsiang et al., "A High-Efficiency FLL-Assisted Current-Controlled DC-DC Converter Over Light-Loaded Range," IEEE Transactions on Circuits and Systems I: Regular Papers, vol. 59, No. 10, pp. 2468-2476, Oct. 1, 2012.
(Continued)

*Primary Examiner* — Thienvu V Tran
*Assistant Examiner* — Shahzeb K Ahmad
(74) *Attorney, Agent, or Firm* — Slayden Grubert Beard PLLC

(57) ABSTRACT

DC-DC power converter control comprises current starved delay lines for phase shifting control signals that set and reset a RS flip-flop to provide controllable PWM pulse widths from narrow to wide at a clock frequency. Precise pulse width control and a guaranteed minimum pulse width for pulse frequency modulation (PFM) control the DC-DC power converter during low power demand is also provided. PFM control maintains the same pulse width while decreasing the number of pulses per second when the output voltage exceeds an upper value and increases the number of pulses per second when the output voltage is less than a lower value. Voltage-to-current converters provide control currents to the current starved delay lines that provide the control signals to the SET and RESET inputs of the RS flip-flop. A D-flip-flop may further be used to improved circuit operation when generating high duty cycle (>50 percent) pulse widths.

20 Claims, 18 Drawing Sheets

(51) Int. Cl.
*H03K 3/037* (2006.01)
*H02M 1/00* (2006.01)

(58) Field of Classification Search
CPC ...... H02M 3/157; H02M 3/158; H02M 3/335; G05F 1/561; H03K 3/037
See application file for complete search history.

(56) References Cited

U.S. PATENT DOCUMENTS

| | | | | |
|---|---|---|---|---|
| 2008/0094861 | A1* | 4/2008 | Wang | H02M 3/156 363/21.11 |
| 2011/0018513 | A1* | 1/2011 | Noda | H02M 3/158 323/282 |
| 2013/0106377 | A1* | 5/2013 | Lee | H02M 3/157 323/282 |
| 2013/0193938 | A1* | 8/2013 | Shook | H03K 7/08 323/271 |
| 2019/0238054 | A1 | 8/2019 | Flaibani et al. | |
| 2019/0319536 | A1* | 10/2019 | Hashiguchi | G06F 1/26 |
| 2020/0389090 | A1* | 12/2020 | Ruan | H02M 3/158 |

OTHER PUBLICATIONS

International Search Report and Written Opinion, Application No. PCT/US2021/013806, 13 pages, dated May 6, 2021.

* cited by examiner

CSDL: CURRENT STARVED DELAY LINE
V2I w/ lim: VOLTAGE TO CURRENT
CONVERSION WITH CURRENT LIMITATION CSDL: CURRENT STARVED DELAY LINE
V2I w/ Ilim: VOLTAGE TO CURRENT
CONVERSION WITH CURRENT LIMITATION

METHOD, SYSTEM AND APPARATUS FOR CONSTANT, HIGH SWITCHING FREQUENCY AND NARROW DUTY RATIO PWM CONTROL OF DC-DC CONVERTERS AND ACCURATE PFM CONTROL AT LIGHT LOAD

RELATED PATENT APPLICATION

This application claims priority to commonly owned U.S. Provisional Patent Application Ser. No. 63/052,525; filed Jul. 16, 2020; entitled "Method, System and Apparatus for Constant, High Switching Frequency and Very Narrow Duty Ratio PWM Control of DC-DC Converters and Accurate PFM Control at Light Load," which is hereby incorporated by reference herein for all purposes.

TECHNICAL FIELD

The present disclosure relates to DC-DC converters and, more particularly, to a constant frequency pulse width modulation (PWM) control architecture for high switching frequency and narrow duty ratio control of DC-DC converters, and accurate narrow pulse width for pulse frequency modulation (PFM) control at low load currents.

BACKGROUND

Ultra-high switching frequency and very narrow duty-ratio operation of DC-DC converters are limited by the speed (propagation delay, reaction time, without limitation) of components used in conventional, constant switching frequency DC-DC converters. The term narrow duty radio is meant to mean fine control over the duty-ratio, and very fine thus means very fine control over the duty radio. These components are, for instance, pulse width modulation (PWM) comparator, artificial voltage ramp generator, analog-to-digital converter (ADC), very high frequency oscillator, without limitation. Design of these components becomes challenging for converters running at high switching frequency and very narrow duty ratio, as constraints like low cost and low power consumption are commonly imposed at the same time. On the other hand, high switching frequency operation helps reduce the size of magnetic components and in turn helps to increase power density of a DC-DC converter, which is essential for space limited applications. Constant switching frequency is preferred for EMI sensitive applications. Very narrow PWM control allows increasing the range of the VOUT/VIN ratio when low currents are drawn by the load and in turn increases the operational voltage range of a DC-DC converter. This is, for instance, extremely important for high voltage step down converters. Therefore, a solution, which can enable high and constant switching frequency operation of DC-DC converters, and at the same time allows narrow duty ratio operation, needs to be found.

Another common feature of a constant switching frequency converter is pulse frequency modulation (PFM) control under light load conditions. The objective is to reduce the converter switching frequency at a light load condition so that higher efficiency can be achieved. This is especially important for a high switching frequency converter, as the switching loss is a significant portion of the total power loss. One key point of PFM mode control is the generation of a minimum ON time. However, at high switching frequency, generating an accurate minimum ON time becomes challenging, as the minimum ON time that has to be generated may be as low as several nanoseconds and it can be easily impacted by the non-ideality of active device and component parameters that may vary over PVT (process, voltage supply, temperature).

As shown in FIG. 12, conventional analog DC-DC converter solutions utilize a comparator and an artificial voltage ramp generator for generating PWM control signals. When working at high switching frequency, the propagation delay of the comparator becomes a limitation for reaching very narrow duty-ratio. A very low propagation delay comparator can be challenging to design and can increase cost. The comparator could also be power hungry when targeting operation at very small propagation delay. At the same time, the artificial voltage ramp generator must work at the same frequency as the converter switching frequency and needs to be synchronized to the switching cycles. Such as artificial voltage ramp generator can be power consuming and challenging to design. For instance, the ramp down of the saw tooth voltage ramp should be as sharp as possible, as it defines the maximum ON time of a converter. In addition, the high slope ramp up imposes further challenges to the design of a low propagation delay comparator, as the comparator needs to guarantee the low propagation delay when comparing highly dynamic transient input signals.

FIG. 13 shows another common approach for realizing DC-DC converters. In these converters, the feedback loop is digitalized via an analog-to-digital convertor (ADC) either at the output of the error amplifier or directly at a voltage divider tap. PWM signal generation (including loop compensation, without limitation) is then done via a digital signal processing block. These converters are called digitalized/digital-controlled DC-DC converters. However, high switching frequency and very narrow duty ratio operation impose challenges to this type of converter. Firstly, the ADC used in the feedback path must be very high speed and the propagation delay must be very low. The design of this can be challenging and implementation costly. Also, to reach the necessary low propagation delay the ADC can require a large die size and require significant power consumption. Secondly, to achieve very narrow duty ratio (high resolution PWM generation), the digital signal processing block must work with a very high frequency (e.g., ultra-high frequency) system clock. Thirdly, the design of a cost-effective very high frequency oscillator is challenging. Finally, a very high frequency system clock may lead to higher power consumption and impact the efficiency of the converter overall.

SUMMARY

Therefore, what is needed is a way to realize constant frequency PWM control of DC-DC converters using high frequency and narrow pulse widths without having to utilize a high speed PWM comparator, artificial voltage ramp generator, ADC, very high frequency oscillator, and other hard to implement and power-hungry components.

According to an embodiment, a method for controlling a DC-DC converter with a constant frequency pulse width modulation (PWM) controller may comprise the steps of: delaying a clock signal by a fixed time with a first delay line, wherein the first delay line provides a first delayed clock signal; delaying the clock signal by a variable time with a second delay line having adjustable time delay, wherein the second delay line provides a second delayed clock signal, and the delay of the second delayed clock signal may be greater than the delay of the first delayed clock signal; providing a power switch controller for coupling to and controlling a power switch of a DC-DC converter, wherein the power switch controller has a first input coupled to the first delayed clock signal and a second input coupled to the second delayed clock signal; and providing an error amplifier having a first input coupled to an output voltage of the DC-DC converter, a second input couple to a reference voltage, and an output for controlling the time delay of the second delayed clock signal from the second delay line, wherein a greater difference between the output voltage and the reference voltage will produce a longer time delay of the second delayed clock signal, whereby the power switch will remain on for a longer time responsive to the greater difference between the output voltage and the reference voltage.

According to a further embodiment of the method may comprise the steps of: providing a first current starved delay line (CSDL) having a digital input coupled to a clock signal having a frequency, and a current input coupled to a first current source for controlling delay time therethrough, wherein the first CSDL may delay the clock signal by a fixed time at an output thereof; providing a second CSDL having a digital input coupled to the clock signal, and a current input coupled to a second current source for controlling delay time therethrough, wherein the second CSDL may delay the clock signal by a variable time at an output thereof, whereby the delay of the clock signal at the output of the second CSDL may be greater than the clock signal at the output of the first CSDL; providing a first RS flip-flop having a set input coupled to the output of the first CSDL, a reset input coupled to the output of the second CSDL, and an output coupled to and controlling a power switch; providing a power inductor coupled to the power switch; providing a capacitor coupled to the power inductor and adapted to supply an output voltage; providing an error amplifier having a first input coupled to the output voltage, a second input coupled to a reference voltage, and an output coupled to a voltage-to-current converter, wherein the current output from the voltage-to-current converter is coupled to the current input of the second CSDL, whereby a larger difference between the output voltage and the reference voltage will produce a larger current output from the voltage-to-current converter and increase the time delay of the clock signal through the second CSDL so that the output of the first RS flip-flop turns on the power switch for a longer time.

According to another embodiment, a constant frequency pulse width modulation (PWM) controller adapted for controlling a DC-DC converter may comprise: a first delay line having a fixed time delay and a clock input coupled to a clock signal, wherein the first delay line provides a first delayed clock signal; a second delay line having a variable time delay and a clock input coupled to the clock signal, wherein the second delay line provides a second delayed clock signal, and the delay of the second delayed clock signal may be greater than the delay of the first delayed clock signal; a power switch controller for coupling to and controlling a power switch of a DC-DC converter, wherein the power switch controller has a first input coupled to the first delayed clock signal and a second input coupled to the second delayed clock signal; and an error amplifier having a first input coupled to an output voltage of the DC-DC converter, a second input couple to a reference voltage, and an output for controlling the time delay of the second delayed clock signal from the second delay line, wherein a greater difference between the output voltage and the reference voltage will produce a longer time delay of the second delayed clock signal, whereby the power switch will remain on for a longer time responsive to the greater difference between the output voltage and the reference voltage.

According to yet another embodiment, a constant frequency pulse width modulation (PWM) controller adapted for controlling a DC-DC converter may comprise: a first RS flip-flop having a set input, a reset input and an output; a first current starved delay line (CSDL) having an input coupled to a clock signal having a frequency, a current input, and an output coupled to the set input of the first RS flip-flop; a first voltage-to-current converter having a current output coupled to the first CSDL current input and a voltage input coupled to a delay reference voltage; a second current starved delay line (CSDL) having an input coupled to the clock signal, a current input, and an output coupled to the reset input of the first RS flip-flop; a second voltage-to-current converter having a current output coupled to the second CSDL current input; a first differential input amplifier having a first input coupled to a reference voltage, a second input for coupling to an output voltage of a DC-DC voltage converter, and an output coupled to a voltage input of the second voltage-to-current converter; wherein the output of the first CSDL delays the clock signal by a fixed delay time determined by the first reference voltage, and the output of the second CSDL delays the clock signal by a variable delay time determined by the output voltage from the first differential input amplifier, and wherein the output from the first RS flip-flop controls a power switch of a DC-DC converter, whereby the power switch may be closed when the output of the first CSDL may be at a high logic level and the output of the second CSDL may be at a low logic level, and open when the output of the second CSDL may be at the high logic level.

According to a further embodiment, the first input of the first differential input amplifier may be a positive input, and the second input thereof may be a negative input. According to a further embodiment, the first differential input amplifier may be an operational amplifier with a local feedback compensation network. According to a further embodiment, the first differential input amplifier may be an operational transconductance amplifier (OTA) with a current-to-voltage output compensation network. According to a further embodiment, may comprise: an AND gate having an output and a first input coupled between the reset input of the first RS flip-flop and the output of the second CSDL, respectively, and a second input for coupling to a minimum ON time circuit; wherein the reset input of the first RS flip-flop remains at the low logic level when the second input of the AND gate may be at the low logic level.

According to a further embodiment, the minimum ON time circuit may comprise: a second RS flip-flop having a set input, a reset input and an output coupled to the second input of the AND gate; a third CSDL having an output coupled to the reset input of the second RS flip-flop, an input coupled to the clock signal, and a current input; a third voltage-to-current converter having a current output coupled to the third CSDL current input; a second differential input amplifier configured as an average calculator and having an output coupled to a voltage input of the third voltage-to-current converter, a first input coupled to a pulse frequency modulation (PFM) voltage reference, and a second input; a resistor coupled between the second input of the second differential input amplifier and a first output of the second flip-flop; and a capacitor coupled between the second input and the output of the second differential input amplifier; wherein the resistor and capacitor may be configured to provide a minimum ON time of the power switch. According to a further embodiment, the first input of the second differential input amplifier may be a positive input, and the second input thereof may be a negative input.

According to a further embodiment, the minimum ON time circuit may comprise: a second RS flip-flop having a set input, a reset input and an output coupled to the second input of the AND gate; a third CSDL having a digital output coupled to the reset input of the second RS flip-flop, an input coupled to the clock signal and a current input; and a third voltage-to-current converter having a current output coupled to the third CSDL current input, and an input coupled to a predefined voltage comprising a delta voltage for determining a minimum ON time. According to a further embodiment, the PFM voltage reference may be equal to the first reference voltage plus a delta voltage to produce a desired delta delay through the third CSDL.

According to still another embodiment, a constant frequency pulse width modulation (PWM) DC-DC converter system may comprise: a power switch coupled to a positive node of a voltage source; a power diode coupled to the power switch and a negative node of the voltage source; a power inductor coupled to the power switch; a capacitor coupled to the power inductor and the negative node of the voltage source; a load coupled to the capacitor and the negative node of the voltage source, whereby a DC output from the DC-DC converter may be provided; a PWM controller comprising: a first RS flip-flop having a set input, a reset input and an output coupled to and controlling the power switch; a first current starved delay line (CSDL) having an input coupled to a clock signal having a frequency, a current input, and a digital output coupled to the set input of the first RS flip-flop; a second current starved delay line (CSDL) having an input coupled to the clock signal, a current input, and an output coupled to the reset input of the first RS flip-flop; a first voltage-to-current converter having a current output coupled to the first CSDL current input and a voltage input coupled to a first reference voltage; a second voltage-to-current converter having a current output coupled to the second CSDL current input; a first differential input amplifier having a first input coupled to a second reference voltage, a second input coupled to the DC output of the DC-DC converter, and an output coupled to a voltage input of the second voltage-to-current converter; wherein the digital output of the first CSDL delays the clock signal by a fixed delay time determined by the first reference voltage, and the digital output of the second CSDL delays the clock signal by a variable delay time determined by the output voltage from the first differential input amplifier and the output from the first RS flip-flop controls the power switch of the DC-DC converter; whereby the power switch may be closed when the output of the first CSDL may be at a high logic level and the output of the second CSDL may be at a low logic level, and open when the output of the second CSDL may be at the high logic level.

According to a further embodiment, the PWM controller may comprise: an AND gate having an output and a first input coupled between the reset input of the first RS flip-flop and the output of the second CSDL, respectively, and a second input adapted for coupling to a minimum ON time circuit; wherein the reset input of the RS flip-flop remains at the low logic level when the second input of the AND gate may be at the low logic level.

According to a further embodiment, the minimum ON time circuit may comprise: a second RS flip-flop having an output coupled to the second input of the AND gate, a set input and a reset input; a third CSDL having an output coupled to a reset input of the second RS flip-flop, an input coupled to the clock signal, and a current input; a third voltage-to-current converter having a current output coupled to the third CSDL current input; a second differential input amplifier configured as an average calculator and having an output coupled to a voltage input of the third voltage-to-current converter, a first input coupled to a pulse frequency modulation (PFM) voltage reference, and a second input; a resistor coupled between the second input of the second differential input amplifier and a first output of the second flip-flop; and a capacitor coupled between the second input and the output of the second differential input amplifier; wherein the resistor and capacitor may be configured to provide a minimum ON time of the power switch.

According to a further embodiment, the minimum ON time circuit may comprise: a second RS flip-flop having a set input, a reset input and an output coupled to the second input of the AND gate; a third CSDL having an output coupled to a reset input of the second RS flip-flop, an input coupled to the clock signal and a current input; and a third voltage-to-current converter having a current output coupled to the third CSDL current input, and an input coupled to a pulse frequency modulation (PFM) voltage reference. According to a further embodiment, the PFM voltage reference may be equal to the first reference voltage plus a delta voltage to produce a desired delta delay through the third CSDL. According to a further embodiment, the PWM controller may comprise a high duty cycle reset circuit coupled between the reset input of the first RS flip-flop and the digital output of the second CSDL, wherein the high duty cycle reset circuit output goes to a logic high only on a level transition from a logic low to a logic high from the output of the second CSDL.

According to a further embodiment, the high duty cycle reset circuit may comprise: a D-flip-flop having a clock input coupled to the output of the second CSDL, a reset input coupled to an output of an AND gate; a first input of the AND gate coupled to a first delay tap of the CSDL and a second input of the AND gate coupled to a second delay tap of the CSDL wherein the second delay tap has a longer time delay than the first delay tap; and an OR gate having a first input coupled to an output of the D-flip-flop, a second input coupled to the output of the AND gate, and an output coupled to the reset input of the first RS flip-flop.

According to a further embodiment, the first RS flip-flop may comprise: a D flip-flop having a Q-output coupled to and controlling the power switch, and an inverted Q-output coupled to a D-input; an OR gate having an output coupled to a clock input of the D flip-flop; a first AND gate having an output coupled to a first input of the OR gate, a first input coupled to the output of the first CSDL, and a second input coupled to the inverted Q-output of the D flip-flop; and a second AND gate having an output coupled to a second input of the OR gate, a first input coupled to the output of the second CSDL, and a second input coupled to the Q-output of the D flip-flop; wherein the Q-output of the D flip-flop goes to a logic high only on a level transition from a logic low to a logic high from the output of the second CSDL.

BRIEF DESCRIPTION OF THE DRAWINGS

A more complete understanding of the present disclosure may be acquired by referring to the following description taken in conjunction with the accompanying drawings wherein.

Figure 1:
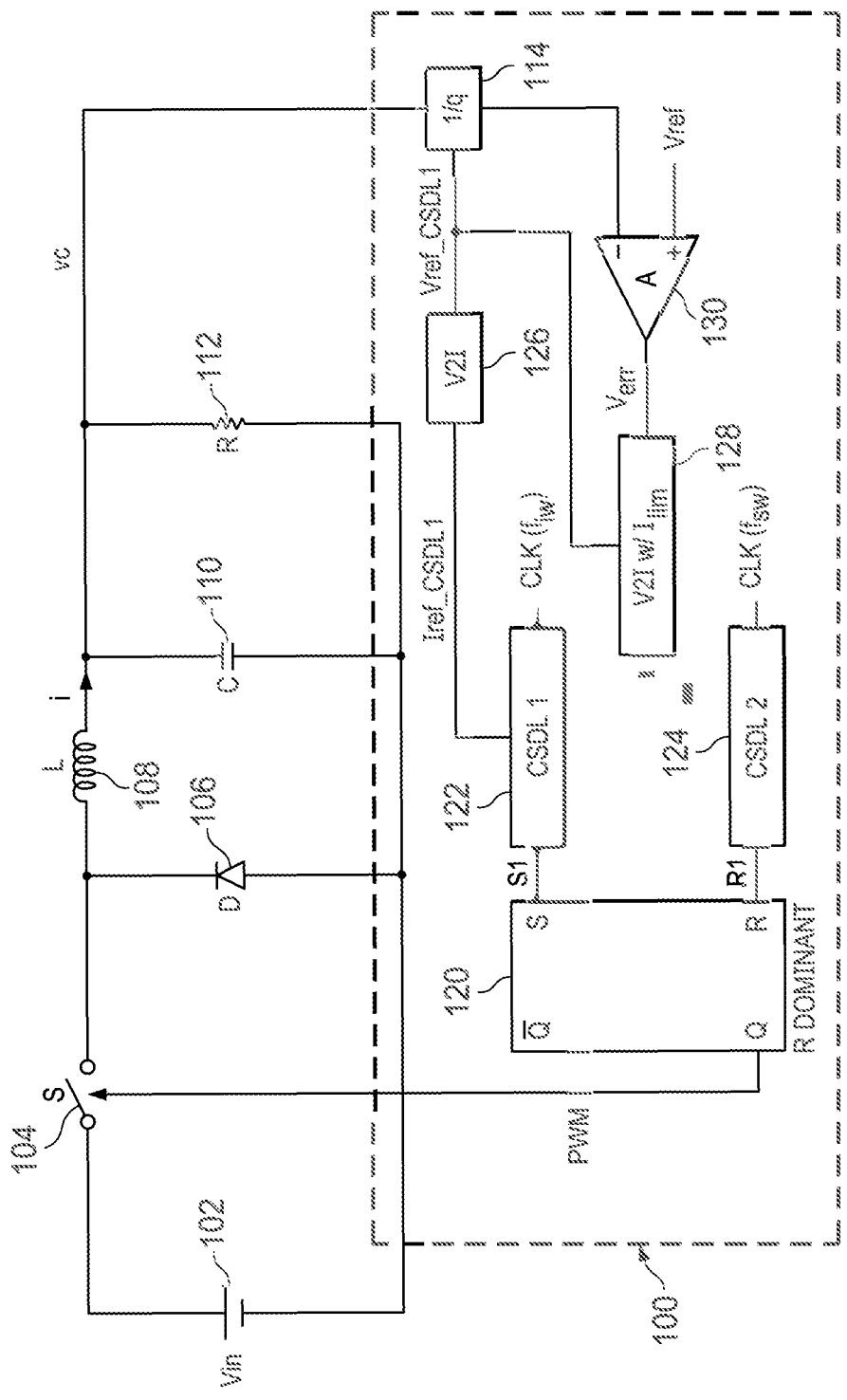
FIG. 1 illustrates a schematic block diagram of a constant frequency control circuit for a DC-DC converter operating in PWM mode, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

In comparison to present technology conventional analog and/or digitally controlled DC-DC power converters, the embodiments of these novel controllers for the DC-DC power converters, according to the teachings of this disclosure and described hereinafter, use simple, digital like components (delay lines and RS flip-flop) for generating a PWM signal and reaches as fine a resolution as can be achieved by analog converters. Bottleneck components, for example but not limited to, high speed comparator, high frequency voltage ramp generator, high speed ADC and ultra-high frequency oscillator are eliminated which are mandatory for conventional present technology DC-DC power converter solutions. The DC-DC power converter control solutions, according to the present invention, are more cost effective, power saving and have higher performance for high and constant switching frequency PWM control of DC-DC converters. Furthermore, very low minimum ON time can be accurately generated.

Another feature commonly requested in a DC-DC power converter is pulse frequency modulation (PFM) control under light load conditions. The advantage of PFM is to reduce the switching frequency so that higher efficiency can be achieved at light load. This is especially important for a high switching frequency DC-DC converter, as the switching loss is a big contributor to the total power loss of the DC-DC converter. Basically, a minimum ON time is defined/generated at first. When the ON time of the DC-DC converter requested by the control loop based on VIN, VOUT, and the load current condition, is smaller than the defined minimum ON time, the output voltage will rise up due to the forced minimum ON time. When the output of the DC-DC converter reaches a predefined upper voltage level, the DC-DC converter will stop switching. The load current at the output of the DC-DC converter defines the slope of the voltage decrease and switching will be restarted again when the output voltage drops to a defined lower voltage level. This operation may be pulse skipping or reducing the number of pulses per second when operation in a PFM (plus frequency modulation) mode. In this way, the average switching frequency can be reduced, and higher efficiency can be achieved at a light load.

Accurate control of minimum ON time is one key challenge for PFM control at high switching frequency. This is simply due to the fact that the minimum ON time becomes so low (can be less than 10 ns), that the traditional way of generating minimum ON time like using a simple delay element or a tap from an oscillator ramp is not sufficiently accurate due to the non-ideality of available components used in the design and implementation thereof.

Embodiments of the present disclosure may comprise current starved delay lines and simple logic circuits, e.g., RS flip-flop, to realize constant frequency PWM control of DC-DC converters. By using such components in a novel fashion, disclosed herein, avoids using bottleneck components mentioned hereinabove, e.g., PWM comparator, artificial voltage ramp generator, ADC and very high frequency oscillator, which are mandatory in conventional DC-DC converters. High speed and very narrow duty ratio PWM generation may be realized based on a simple logic circuit (a RS flip-flop for instance), which can work up to hundreds of MHz and completely removes the limitation that has to be overcome in conventional DC-DC converter topologies.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a schematic block diagram of a constant frequency control circuit for a DC-DC converter operating in PWM mode, according to specific example embodiments of this disclosure. The DC-DC converter is coupled to a voltage source providing an input voltage Vin 102, a positive lead of which is connected to a first pole of power switch 104, labelled S, which may be constituted of a power switching transistor. A second pole of power switch 104 is connected to a first end of a power inductor 108, having an inductance L, and to the cathode of a power diode 106, labelled D. The second end of power inductor 108, carrying current i and having voltage vc, is connected to a first end of capacitor 110, having a capacitance C, to the first end of a load 112, having a resistance R, and to voltage divider 114. A second end of load 112 is connected to a second end of capacitor 110, to the anode of power diode 106 and to the negative lead of voltage source 102. Power switch 104 is controlled by a Q output of an RS flip-flop 120, with a signal labelled PWM, which will be described below. The power switch 100 is closed when the Q-output of the RS flip-flop 120 is at a high logic level and open when the Q-output of the RS flip-flop 120 is at a low logic level.

The constant frequency control circuit 100 may comprise a reset-set (RS) flip-flop 120, a first current starved delay line (CSDL 1) 122, a second current starved delay line (CSDL 2) 124, a first voltage-to-current converter (V2I) 126, a second voltage-to-current converter (V2I) 128, a differential input amplifier (A) 130, and a voltage divider 114. The RS flip-flop 120 is preferably reset dominant, which means that if both set and reset inputs are asserted, the reset input dominates. The switching frequency of the DC-DC converter may be defined by a clock signal (CLK) at a frequency of fsw, which may be coupled to the digital inputs of the first and second current starved delay lines (CSDL 1 and CSDL 2) 122 and 124. The delay inserted by the first current starved delay line (CSDL 1) 122 may be defined by a reference current Iref_CSDL1. Iref_CSDL1 is a fixed current whose amplitude may be, for instance, defined by a delay reference voltage Vref_CSDL1. The reference current Iref_CSDL1 may be derived from the reference voltage Vref_CSDL1 by using a voltage-to-current converter of any type, in this embodiment of the invention it is represented by first voltage-to-current converter (V2I) 126. The delay inserted by the second current starved delay line (CSDL 2) 124 may be controlled by a regulation loop via the output of the error amplifier (Verr) 130. Verr may be generated by the error amplifier (A) 130 responsive to comparing the output voltage (vc) from the DC-DC converter, after division by voltage divider 114, with a reference voltage (Vref). Verr is fed as input to second voltage-to-current converter (V2I) 128, which second voltage-to-current converter (V2I) 128 receives as a second input delay reference voltage Vref_CDSL1. The power switch 104 is closed when the output of the first CSDL 122 is at a high logic level and the output of the second CSDL 124 is at a low logic level, and open when the output of the second CSDL 124 is at the high logic level.

The relative delay/phase shift between the outputs of the first and second current starved delay lines 122 and 124, respectively, define the required PWM duty ratio. Delay reference voltage Vref_CDSL1 and reference voltage Vref may derived independently or may be derived from the same voltage source depending upon circuit implementation and is contemplated herein for all purposes. The error amplifier 130 may also be an operational amplifier with a local feedback compensation network, or an operational transconductance amplifier (OTA) with an output compensation network for converting the current output of the OTA to a voltage output.

To ensure that the delay provided by the second current starved delay line 124 is always larger than the delay provided by the first current starved delay line 122, the maximum biasing current which is delivered to the second current starved delay line 124 is limited to be no more than Iref_CSDL1. In order to accomplish same, the second voltage-to-current converter (V2I) 128 is arranged to convert the error voltage Verr to a current, which current is limited by current reference voltage Vref_CDSL1. Depending on how the second voltage-to-current converter (V2I) 128 is implemented, there may be different ways for limiting the maximum biasing current of the second current starved delay line (CSDL 2) 124 to Iref_CDSL1. One possible way of implementing the second voltage-to-current converter (V2I) 128 is described and shown hereinafter.

Conceptually, as disclosed hereinabove, the invention utilizes only a reset-set (RS) flip-flop with its set and reset inputs being respectively controlled by the first and second current starved delay lines 122, 124 for generating PWM control signals (FIG. 1). A clock signal (CLK) may be coupled to the inputs of both current starved delay lines 122 and 124. This clock signal (CLK) can be generated by an oscillator and defines the switching frequency of the DC-DC converter. The first current starved delay line 122 is responsible for generating the "set" signal to the RS flip-flop 120. The total delay of a current starved delay line is defined by a chain of current starved delay elements. The biasing current of the first current starved delay line 122 is Iref_CSDL1 and it may be a fixed reference current generated by the first voltage-to-current converter 126 with its input defined as Vref_CSDL1. Vref_CSDL1, at the same time, defines the maximum allowed current that biases the delay elements in the second current starved delay line 124. This can be done, for instance, via clamping the input Verr of the second voltage-to-current converter 128 to Vref_CSDL1. In other words, the minimum delay inserted by the second current starved delay line 124 cannot be smaller than the delay inserted by the first current starved delay line 122. Therefore, the duty ratio is always positive. The biasing current of the second current starved delay line 124 may be dynamically defined by the output of the error amplifier 130. This can be done, for instance, via a second voltage-to-current converter 128 with its input connected to the output of the error amplifier 130 and its output used as the biasing current for the second current starved delay line 124. Depending on the implementation of the second voltage-to-current converter 128, its input port could function with a negative or a positive input voltage. In this example Verr is a negative voltage and connected to the input port of the second voltage-to-current converter 128. Therefore, when the output of the error amplifier (Verr) drops (for instance during a small overshoot of the regulated output), the biasing current output by second voltage-to-current converter 128 increases and the delay generated by the second current starved delay line 124 becomes smaller. The phase shift between the output of the two delay lines becomes smaller and a smaller duty ratio is applied to remove the overshoot at the regulated output. A larger output from the error amplifier 130 corresponds to a lower biasing current output by the voltage-to-current converter 128 which increases the delay generated by the second current starved delay line 124 and leads to a higher pulse duty ratio. As previously mentioned, the maximum biasing current of the second current starved delay line 124 is limited to the biasing current of the first delay line, and as a result the duty ratio generated will always be greater than or equal to zero percent (0%).

This can be, for instance, achieved by using a voltage-to-current converter with a differential input stage (not shown). For example, by connecting Vref_CSDL1 to a positive input port of the first differential input voltage-to-current converter 126 and 0V to a negative input port of the first differential input voltage-to-current converter 126, the differential input voltage Vref_CSDL1-0V defines the output current of the first differential input voltage-to-current converter 126. In the second voltage-to-current converter 128, Vref_SDL1 is connected to a positive input port thereof and Verr output from error amplifier 130 is connected to a negative input port of the second voltage-to-current converter 128 (not shown). As Verr cannot be lower than 0V, the differential input of the second voltage-to-current converter 128 cannot be larger than that in the first voltage-to-current converter 126 and the output current of the second voltage-to-current converter 128 therefore cannot be higher than the output current of the first voltage-to-current converter 126.

Figure 2:
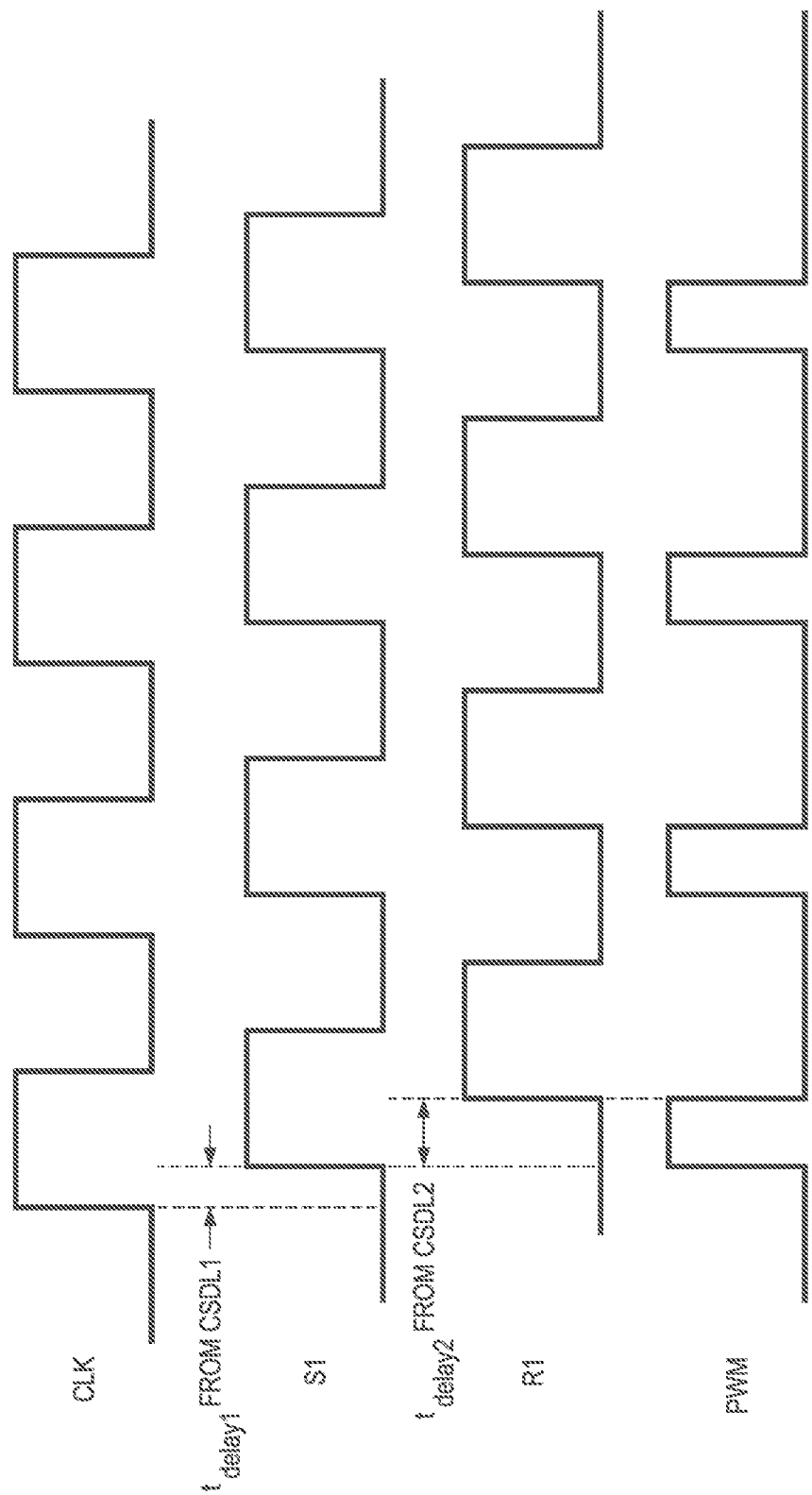
FIG. 2 illustrates a schematic signal waveform timing diagram of the PWM control circuit shown in FIG. 1.

Referring to FIG. 2, depicted is a schematic signal waveform timing diagram of the constant frequency PWM control circuit 100 shown in FIG. 1. The waveform timing relationships of the clock (CLK), the output (S1) of the first current starved delay line (CSDL 1) 122 coupled to the SET input of the RS flip-flop 120, the output (R1) of the second current starved delay line (CSDL 2) 124 coupled to the RESET input of the RS flip-flop 120, and the Q output (PWM) of the RS flip-flop 120 are illustrated in FIG. 2.

Two methods based on current starved delay lines are disclosed for generating accurate minimum ON time control signals, according to specific example embodiments of the invention. The first method enabled herein regulates the minimum ON time via a voltage that is proportionally related to it. A PWM signal with Vsupply at logic high and 0V at logic low can be averaged for each PWM cycle and the average voltage of each PWM cycle should be Vsupply * duty ratio. Therefore, knowing Vsupply, regulating the average voltage is equivalent to regulate the duty ratio.

Figure 3:
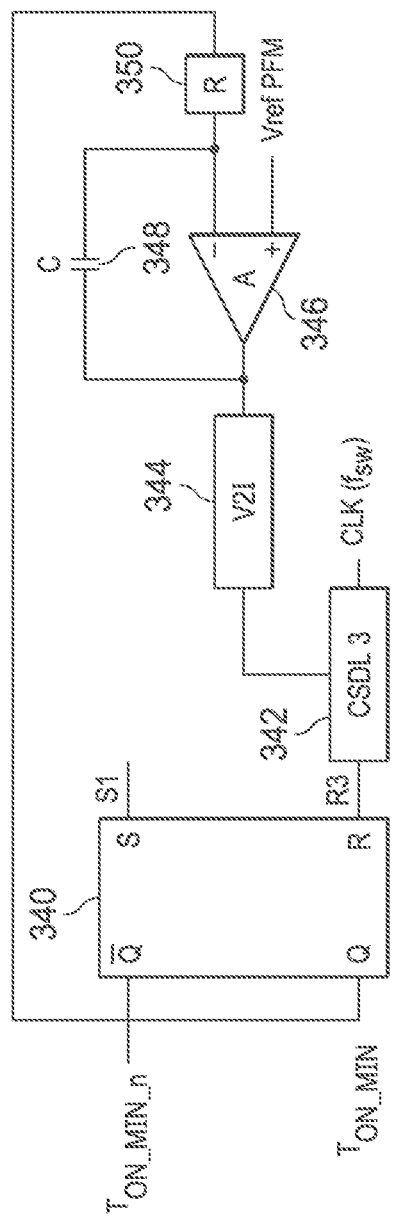
FIG. 3 illustrates a schematic block diagram of a circuit for generating a minimum ON time of the DC-DC converter power switch, according to specific example embodiments of this disclosure.
Figure 4:
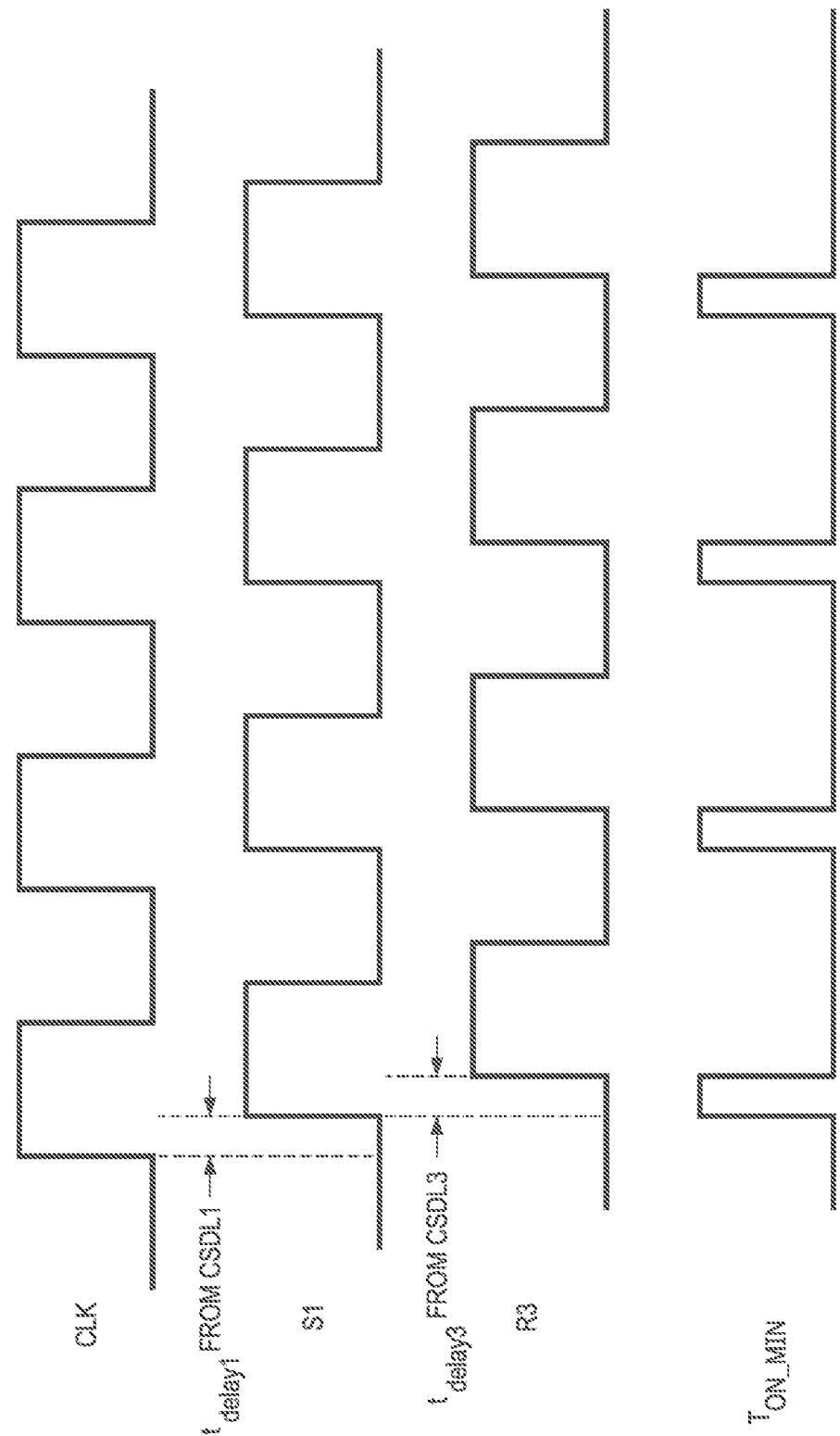
FIG. 4 illustrates a schematic signal waveform timing diagram of the minimum ON time circuit shown in FIG. 3.

Referring to FIGS. 3 and 4, depicted are a schematic block diagram of a circuit for generating a minimum ON time of the DC-DC converter power switch, and a schematic signal waveform timing diagram of the operation thereof, according to specific example embodiments of this disclosure. As shown in FIG. 3, the first method is based on a third current starved delay line (CSDL 3) 342 that may be used to generate a fixed phase shift in reference to the output signal S1 of the first current starved delay line (CSDL 1) 122, as shown in FIG. 1. The output signal S1 of the first current starved delay line 122 (see FIG. 1) connected to the set input of the RS flip-flop 120 is further connected to a set input of an RS flip-flop 340. A differential input amplifier 346 may be configured as an average calculator and may be used to regulate the fixed phase shift as defined by a PFM reference voltage (Vref_PFM) connected to the positive input of the amplifier 346. The output of the amplifier 346 (configured as an average calculator) is fed to a third voltage-to-current converter 344, and the output of third current starved voltage-to-current converter 344 defines the biasing current for the delay element in the third delay line 342. The output R3 of the third current starved delay line 342 is connected to the reset input of the RS flip-flop 340. Resistor 350 and capacitor 348 may be configured appropriately for the switching frequency so as to produce $T_{ON\_MIN}$ or $T_{ON\_MIN\_n}$ which may be used to blank signal R1 (RESET input of RS flip-flop 120) for setting a minimum ON time of the power switch 104. $T_{ON\_MIN\_n}$ may be used via AND gate 650 to reset RS flip-flop 620 (FIG. 6).

As indicated above, the positive input of the amplifier 346 is connected to the PFM reference voltage (Vref_PFM) which defines the minimum ON time. The PFM reference voltage can be a ratio of the supply voltage of the average calculator and the RS flip-flop 340 and in this case a fixed minimum ON time will be regulated which corresponds to Vsupply * duty ratio=Vref_PFM. The reference voltage can also be generated by some other circuit function blocks, for instance, based on the input voltage level of the DC-DC converter. In this case the minimum ON time can be adjusted based on the input voltage level of the DC-DC converter, as more fully disclosed hereinafter. The Q output of the RS flip-flop 340 may be used as the minimum ON time pulse signal. The output signal S1, output signal R3 (output of the third current starved delay line 342), and $T_{ON\_MIN}$ are illustrated in FIG. 4.

Figure 5:
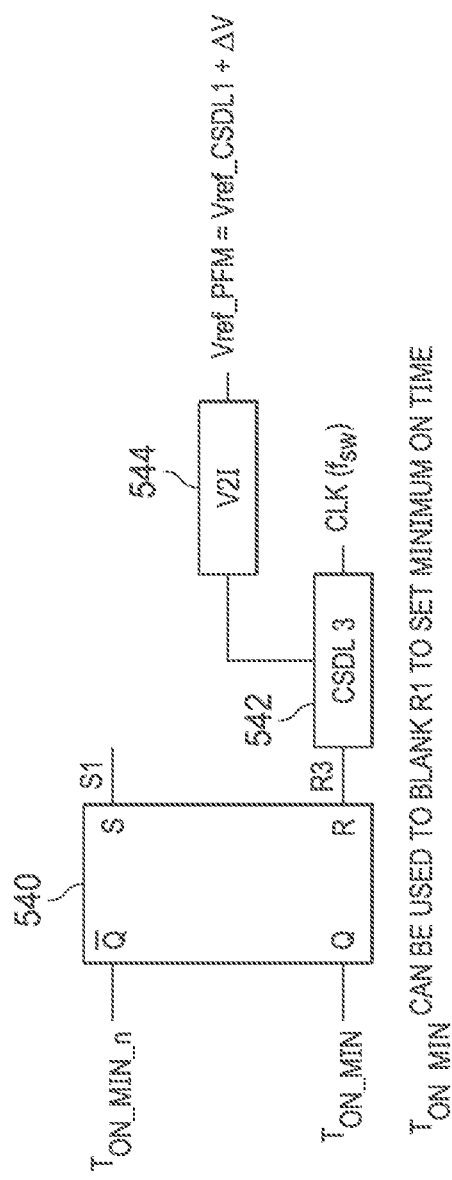
FIG. 5 illustrates a schematic block diagram of another circuit for generating a minimum ON time of the DC-DC converter power switch, according to specific example embodiments of this disclosure.

Referring to FIG. 5, depicted is a schematic block diagram of another circuit for generating a minimum ON time of the DC-DC converter power switch, according to specific example embodiments of this disclosure. In this approach an accurate minimum ON time is provided by controlling the biasing current of the third current starved delay line (CSDL 3) 542 directly with a voltage-to-current converter 544 having an input from a predefined voltage or voltages, e.g., Vref_PFM=Vref_CSDL1+ΔV. ΔV may define the relative delay inserted by the third current starved delay line (CSDL 3) 542 with respect to the delay inserted by the first current starved delay line (CSDL 1) 122 (FIG. 1), whose output signal S1 is fed to the set input of an RS flip-flop 540. The output of third current starved delay line 543, denoted signal R3, is fed to the reset input of the RS flip-flop 540. By choosing an appropriate ΔV, the minimum ON time control signal can be generated. The Q-output of the RS flip-flop 540 is the minimum ON time pulse signal TON_MIN controlling the power switch 104. Ton_min and Ton_min_n are equivalent minimum on time control signals. Depending on the implementation (design), a DC-DC converter may require a positive logic signal (Ton_min) or a negative logic signal (Ton_min_n). In FIG. 6 the negative logic signal (Ton_min_n) is used to control the minimum ON time (i.e., when Ton_min_n is a logic zero so will the output of the AND gate 650 will be a logic zero).

Figure 6:
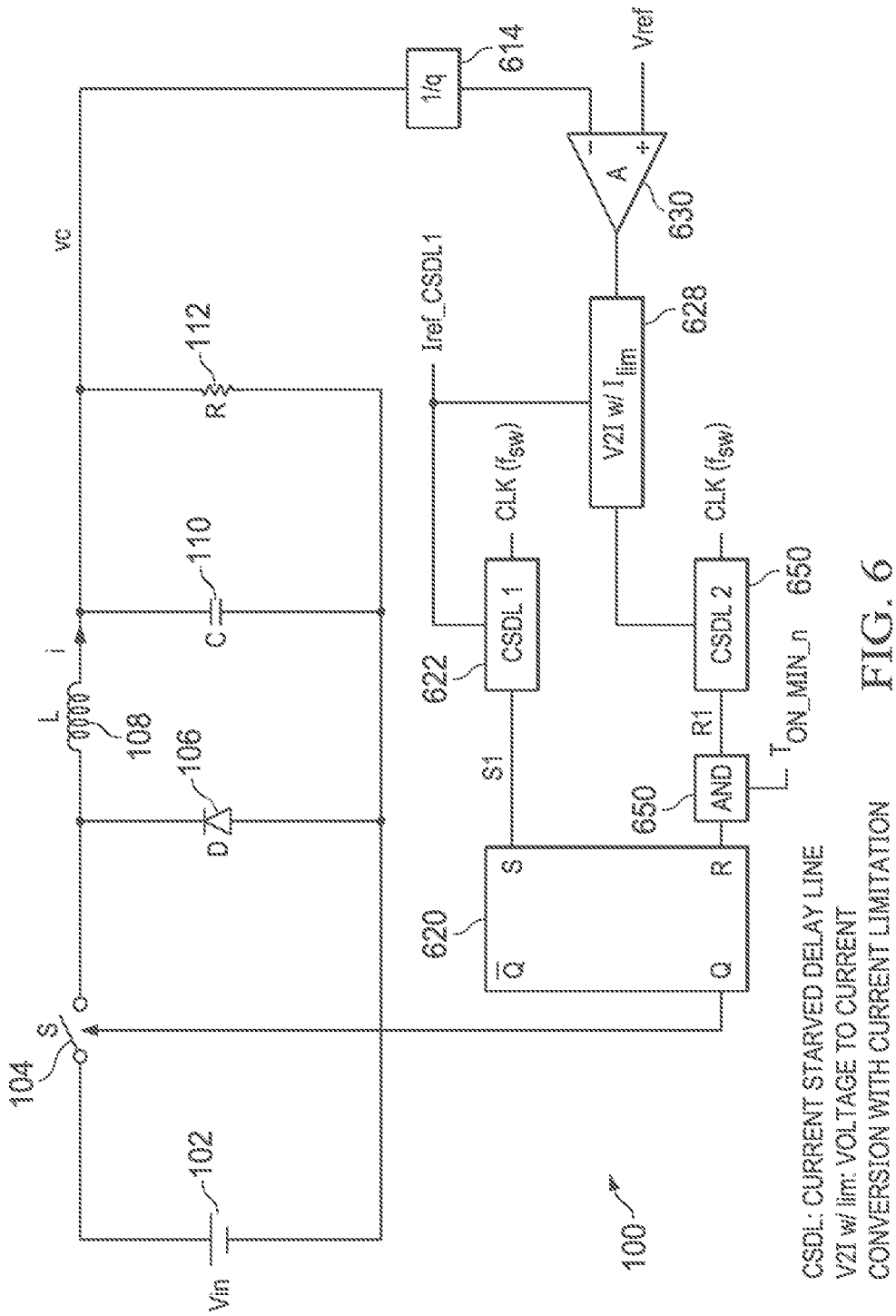
FIG. 6 illustrates a schematic block diagram of a constant frequency PWM control circuit having minimum ON time control for a DC-DC converter, according to specific example embodiments of this disclosure.

Referring to FIG. 6, depicted is a schematic block diagram of a constant frequency PWM control circuit for a DC-DC converter operating in PWM mode having minimum ON time control for a DC-DC converter, according to specific example embodiments of this disclosure. The circuit embodiment shown in FIG. 6 works in substantially the same way as the circuit shown in FIG. 1, like elements have the same reference numbers. As shown in FIG. 6 the inverted minimum ON time pulse $T_{ON\_MIN\_n}$ may be used to blank out the R1 signal generated by the second current starved delay line 124 through an "AND" gate 650 which in turn ensures that the power switch 104 will be closed for a minimum ON time every switching cycle.

For illustrative and explanation purposes, a high voltage buck DC-DC converter, as shown in FIG. 1, has been used but one having ordinary skill in the art of DC-DC power converters and the teachings of this disclosure could apply the teachings disclosed herein to other DC-DC power converter topologies and is contemplated herein. For example, but without limitation, the input voltage of the DC-DC power converter may swing from 20 volts to 80 volts. The expected output voltage of the converter is typically 12 volts DC. The switching frequency may be five (5) MHz in this example. Simulations show that the buck converter can work appropriately under different boundary conditions.

Figure 7:
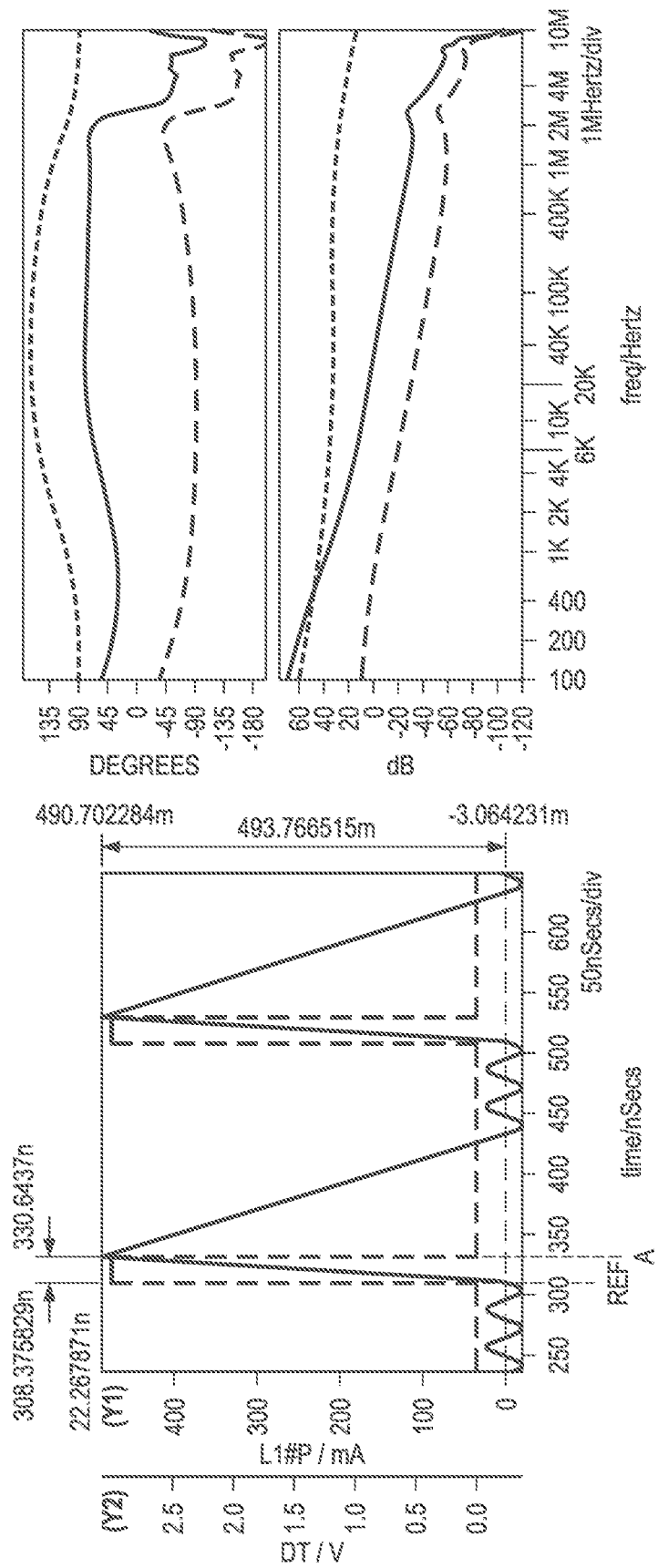
FIGS. 7-9 illustrate schematic simulation waveforms of power switch gate control, inductor currents and control loop bode plots, according to specific example embodiments of this disclosure.
Figure 8:
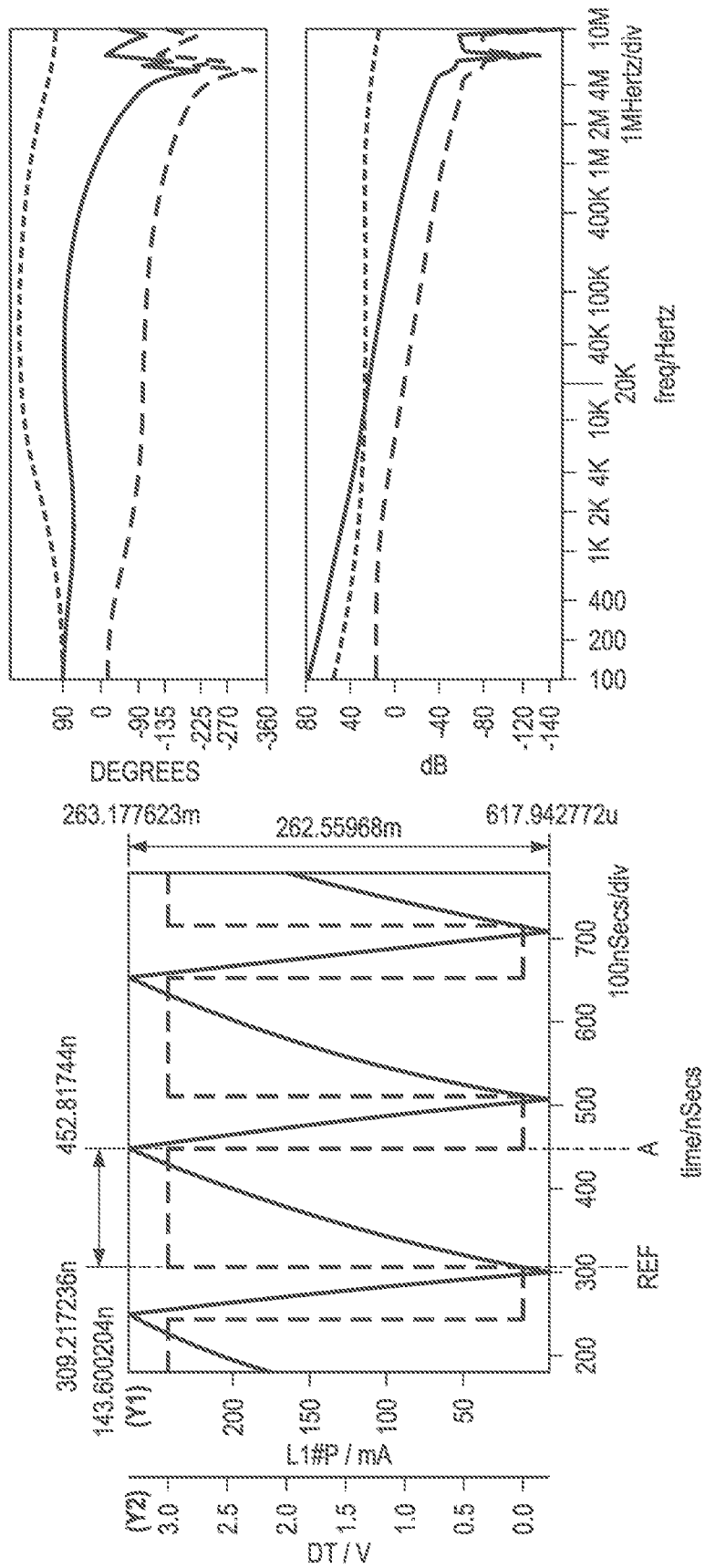
Figure 9:
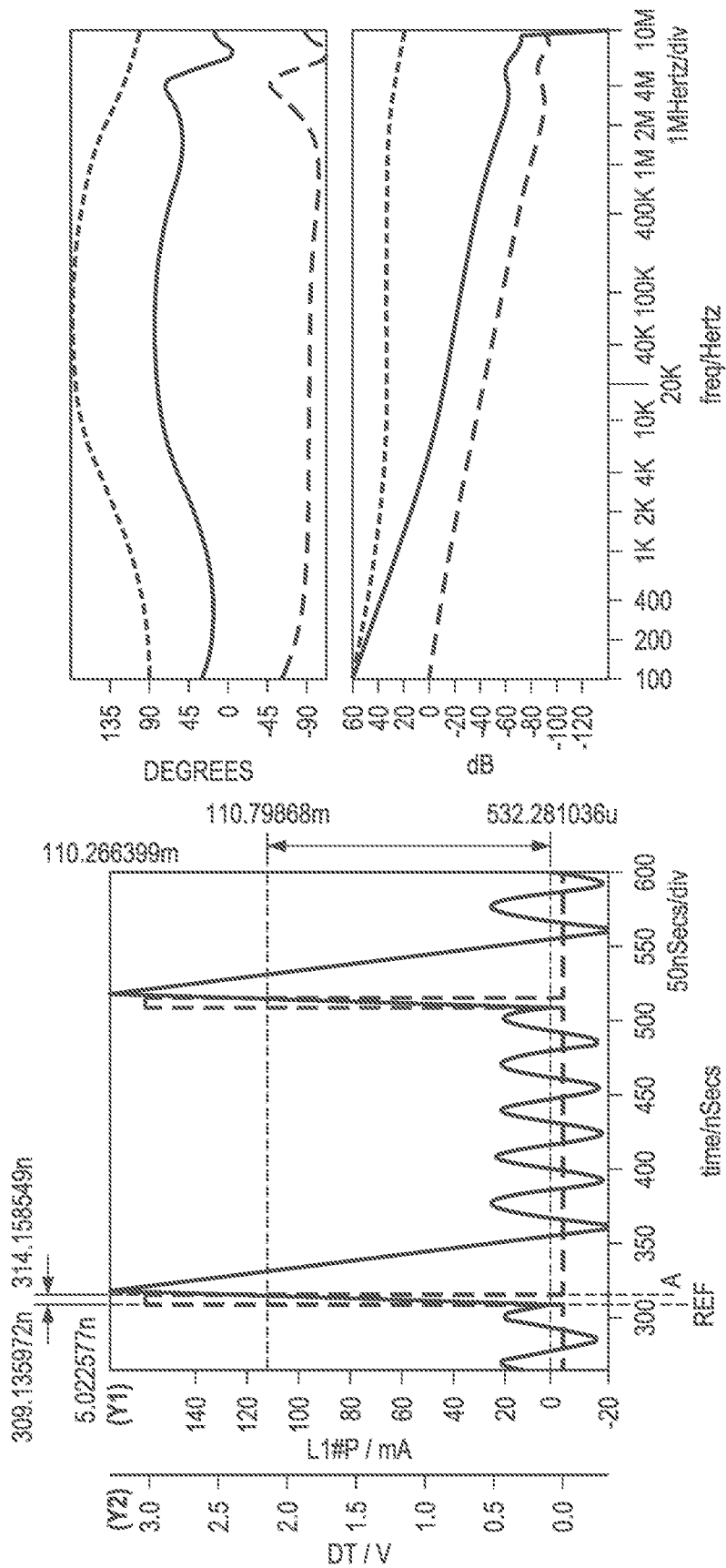

Referring to FIGS. 7-9, depicted are schematic simulation waveforms of power switch gate control, inductor currents and control loop bode plots, according to specific example embodiments of this disclosure.

As shown in FIG. 7, wherein Load=150 mA, VIN=80V, VOUT=12V, $f_{sw}$=5 MHz, gate control signal shown in the line having the longer dashes and inductor current shown in the solid line and control loop bode plot (right). Under heavy load condition (150 mA) and maximum input voltage (80 volts), the converter is working with an ON time of about 22 ns. The crossover frequency is about 30 kHz and the phase margin is sufficiently high.

As shown in FIG. 8, Load=150 mA, VIN=20V, VOUT=12V, $f_{sw}$=5 MHz, gate control signal is shown in the line having the longer dashes and inductor current is shown in the solid line (left). The control loop bode plot is the right graph. TON is about 140 ns. When VIN drops to 20 volts, the duty ratio becomes larger.

As shown in FIG. 9, Load=20 mA, VIN=80V, VOUT=12V, $f_{sw}$=5 MHz, PFM mode disabled, gate control signal in the line having the longer dashes and inductor current in solid line (left) and control loop bode plot (right). The crossover frequency shifts to close to 400 kHz. At light load (20 mA) and maximum input voltage VIN=80V, the ON time becomes as short as 5 ns and the AC analysis shows a crossover frequency of below 10 kHz and the converter is still stable.

The simulation results confirm that the current starved delay line based PWM generation works as expected. The limitation to generate narrow PWM signals at high switching frequency, that is inserted by the feedback path in conventional converters, has been completely removed.

Figure 10:
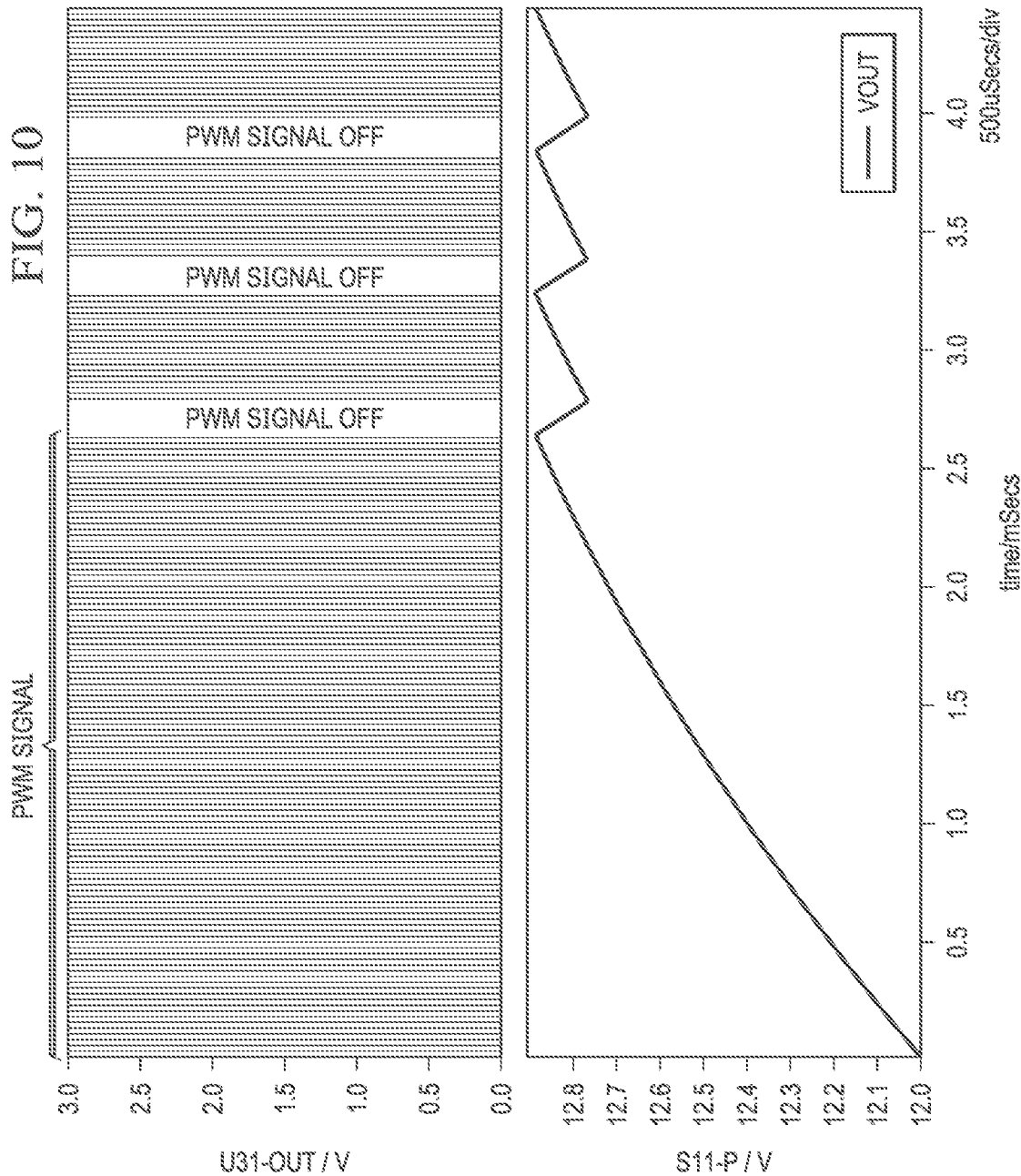
FIG. 10 illustrates schematic simulation waveforms of the constant frequency control circuit operating in PFM mode, according to specific example embodiments of this disclosure.
Figure 11:
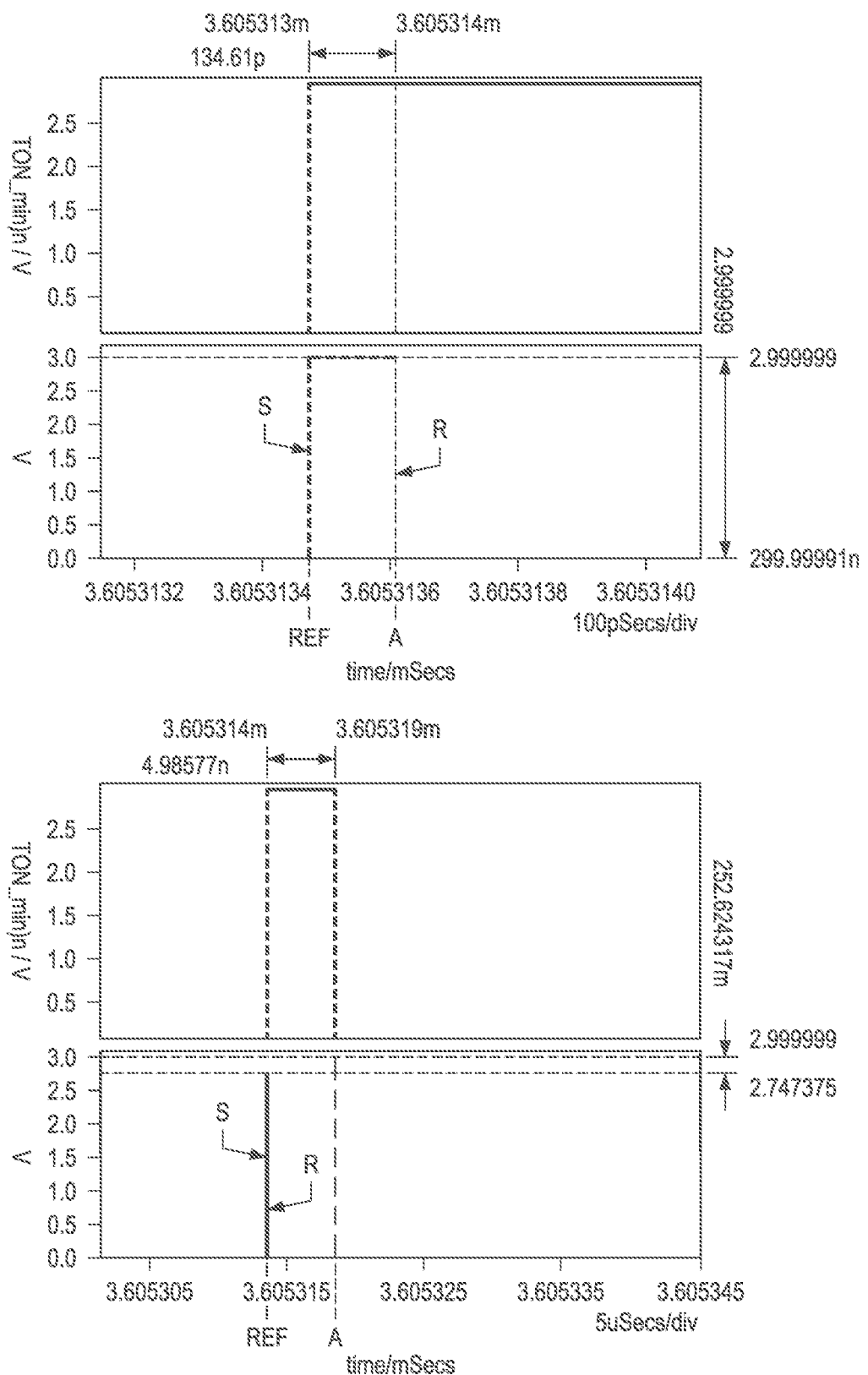
FIG. 11 illustrates schematic simulation waveforms of set and reset signals of the PWM register shown in FIG. 1 without applying PFM control and minimum ON time generated by the circuits shown in FIGS. 3 and 5.
Figure 12:
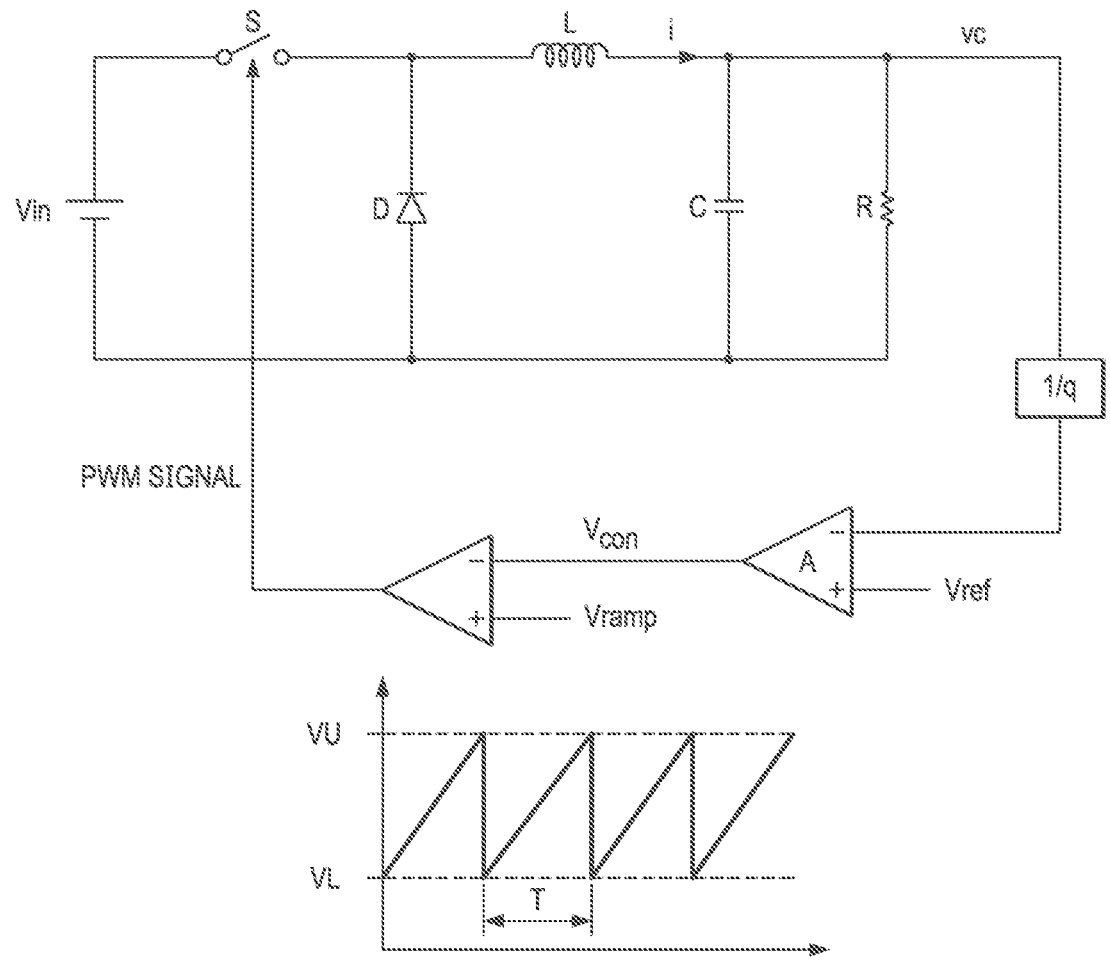
FIG. 12 illustrates a prior art schematic block diagram of an analog control circuit for a DC-DC converter operating in PWM mode.
Figure 13:
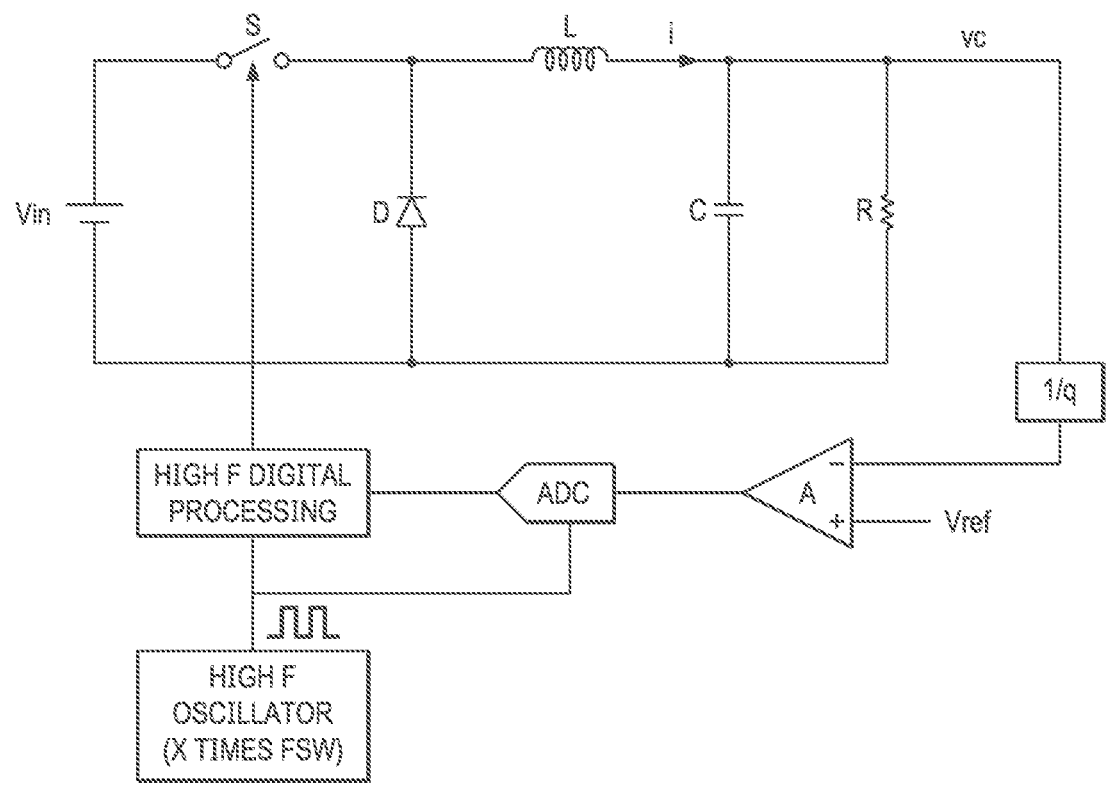
FIG. 13 illustrates a prior art schematic block diagram of a digital control circuit for a DC-DC converter operating in PWM mode.

Referring to FIG. 10, depicted are schematic simulation waveforms of the constant frequency control circuit operating in PFM mode, according to specific example embodiments of this disclosure. The PFM mode control is illustrated via waveform simulations shown in FIGS. 10 and 11. In this example, the reference voltage for defining minimum ON time, Vref_PFM, is 75 mV, which corresponds to a duty ratio of 2.5% at the supply of the average calculator is 3V. This leads to a minimum ON time of 5 ns for the 5 MHz switching frequency. The simulation shows accurate regulation of the minimum ON time. As shown in FIG. 10, the converter is only switching partially. Gaps in the PWM signal are where the DC-DC power converter is not switching, and average switching frequency is therefore reduced. The VOUT line graph shows that when the DC-DC converter is switching, VOUT rises due to the inserted minimum ON time. When VOUT reaches a predefined level, the DC-DC converter will stop switching. Then VOUT drops due to load until a lower-level threshold is reached, where the DC-DC converter will start switching again. As shown in FIG. 11, even when the ON time defined by the control loop may be as short as 135 picosecond, the minimum ON time generated is precisely 5 ns and it clamps the final minimum ON time to5 ns. The simulation results confirms that an accurate PFM control in a high switching frequency converter is enabled.

Figure 14:
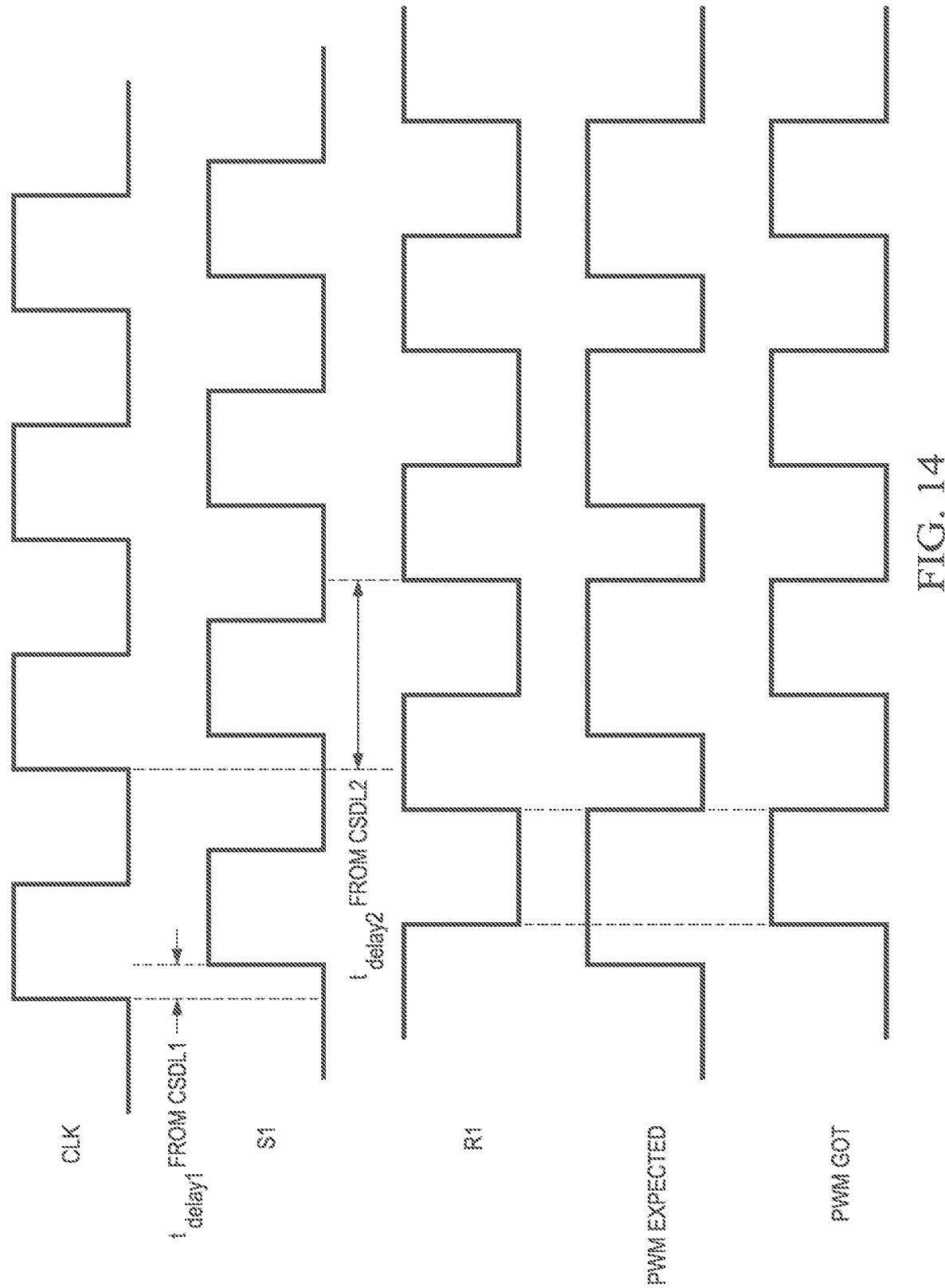
FIG. 14 illustrates a schematic signal waveform timing diagram of the PWM control circuit shown in FIG. 1 when the PWM duty cycle is greater than fifty (50) percent, according to specific example embodiments of this disclosure.

Referring to FIG. 14, depicted is a schematic signal waveform timing diagram of the PWM control circuit shown in FIG. 1 when the PWM duty cycle is greater than fifty (50) percent, according to specific example embodiments of this disclosure. By comparing the signal "PWM expected" and the signal "PWM got" a problem is illustrated. Due to the reset dominant characteristic of the RS-flip-flop 120 in FIG. 1, the PWM control signal will be disturbed when the duty ratio requested by the control loop becomes larger than 50% as the high level of RESET (R1) and SET (S1) signals of the RS flip-flop will overlap. This problem can be solved by translating the reset of the RS flip-flop in FIG. 1 from a level triggered reset to an edge triggered reset.

Figure 15:
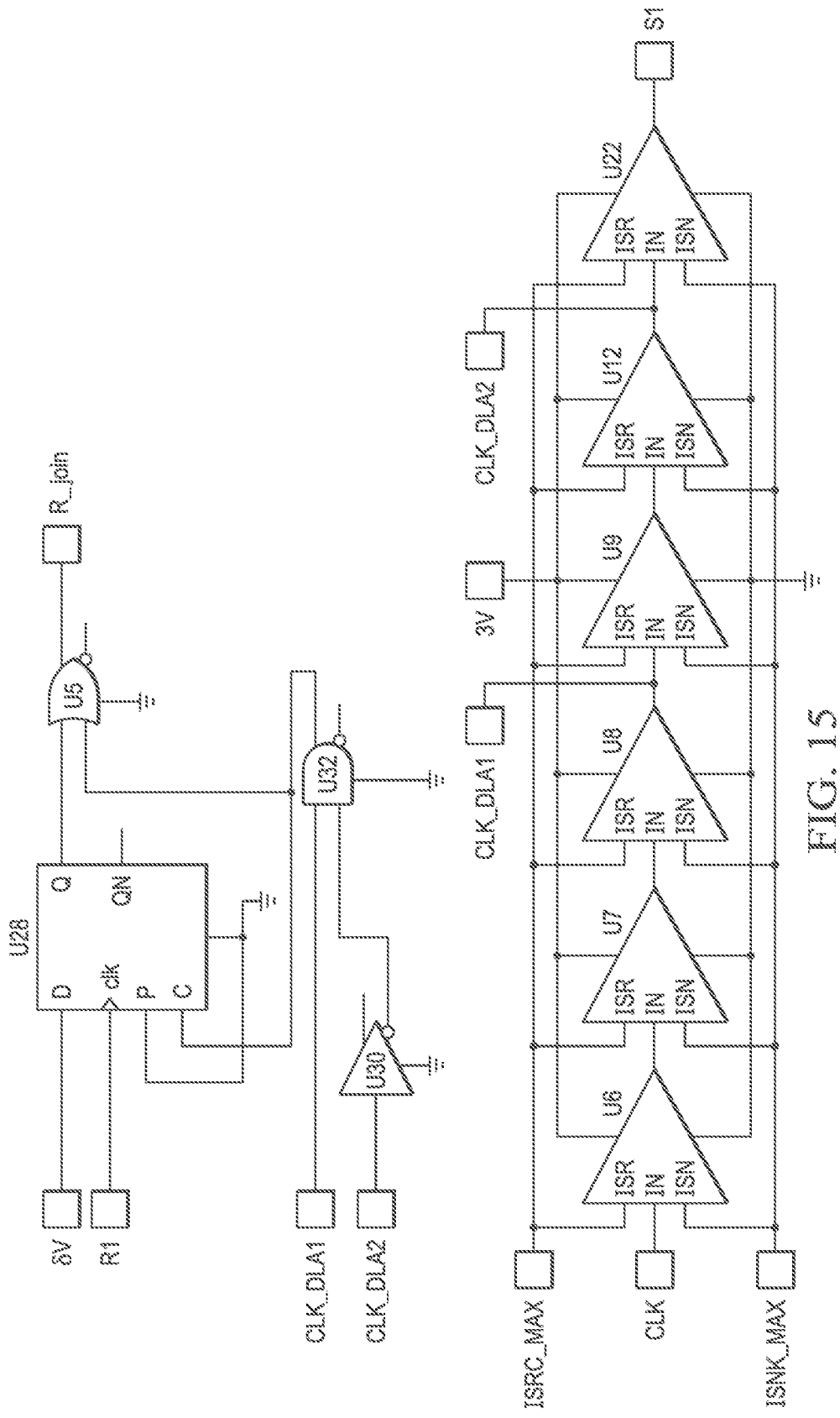
FIG. 15 illustrates a schematic diagram of a circuit for solving triggering issues when PWM duty cycles are larger than 50 percent, according to specific example embodiments of this disclosure.

Referring to FIG. 15, depicted is a schematic diagram of a circuit for solving triggering issues when PWM duty cycles are larger than 50 percent, according to specific example embodiments of this disclosure. This can be done, for instance, via a D flip-flop shown in FIG. 15. The output R1 of the second delay line 124 (shown in FIG. 1) is connected to the clock input of the D flip-flop. The output of the D flip-flop will only be set to '1' when a positive edge of the R1 signal is detected. A short reset pulse is generated at the end of every switching cycle to reset the D flip-flop. This may be done by taking two taps (CLK_DLA1 and CLK_DLA2) at the end of the first current starved delay line 122 and logically combining them together. The final reset signal for the RS flip-flop 120 in FIG. 1 becomes "R_join" which is a logical OR combination of the D-flip-flop output Q and the D flip-flop reset signal. The D-flip-flop reset signal also defines the maximum ON time of the converter as this is the latest possible reset of RS flip-flop shown in FIG. 1.

Figure 16:
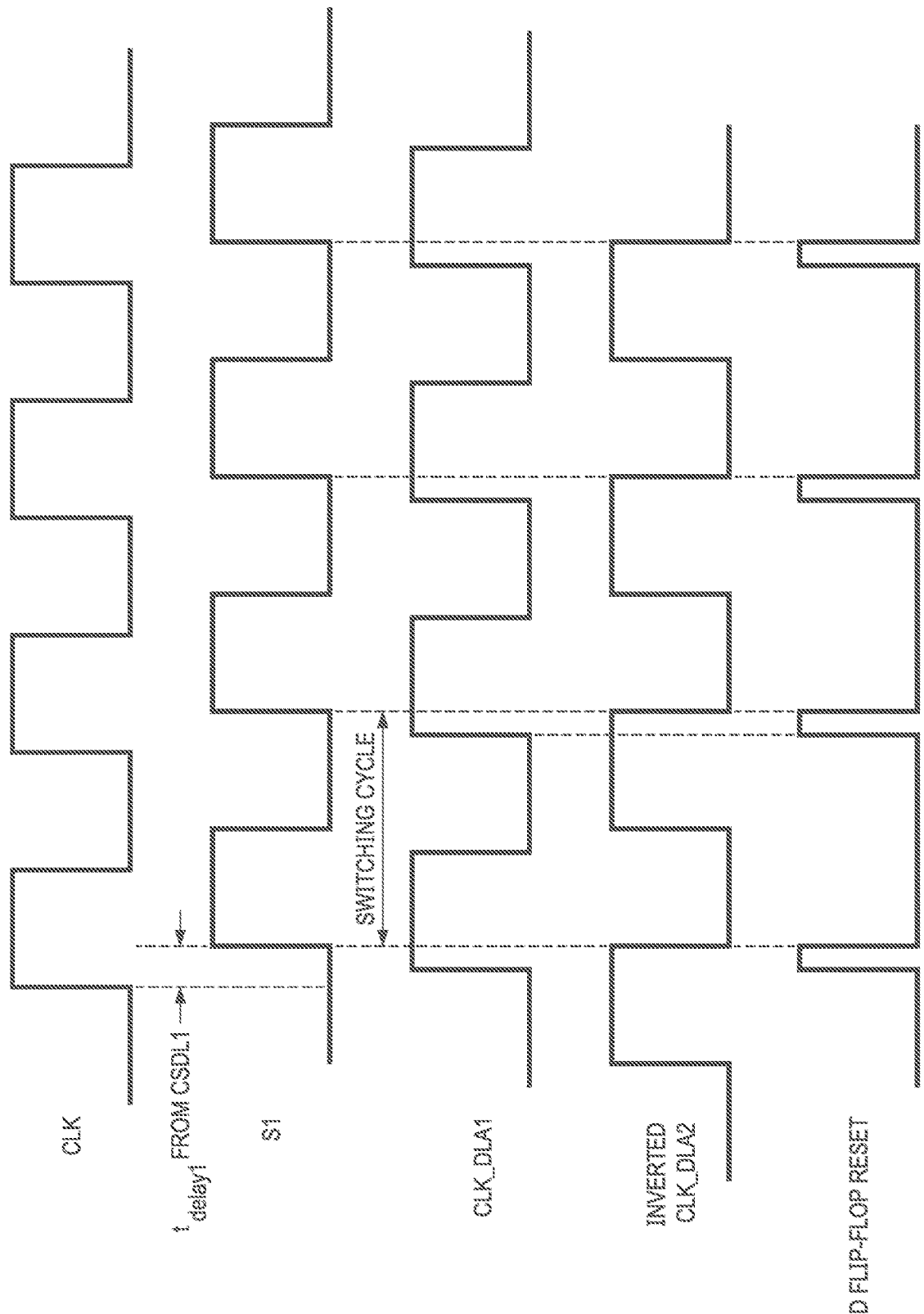
FIG. 16 illustrates a schematic signal waveform timing diagram of the circuit shown in FIG. 15.

Referring to FIG. 16, depicted is a schematic signal waveform timing diagram of the circuit shown in FIG. 15. FIG. 16 shows the relationship among different signals related to the D flip-flop reset signal generation. A short pulse may be generated at the end of each switching cycle as shown on the bottom of FIG. 16.

Figure 17:
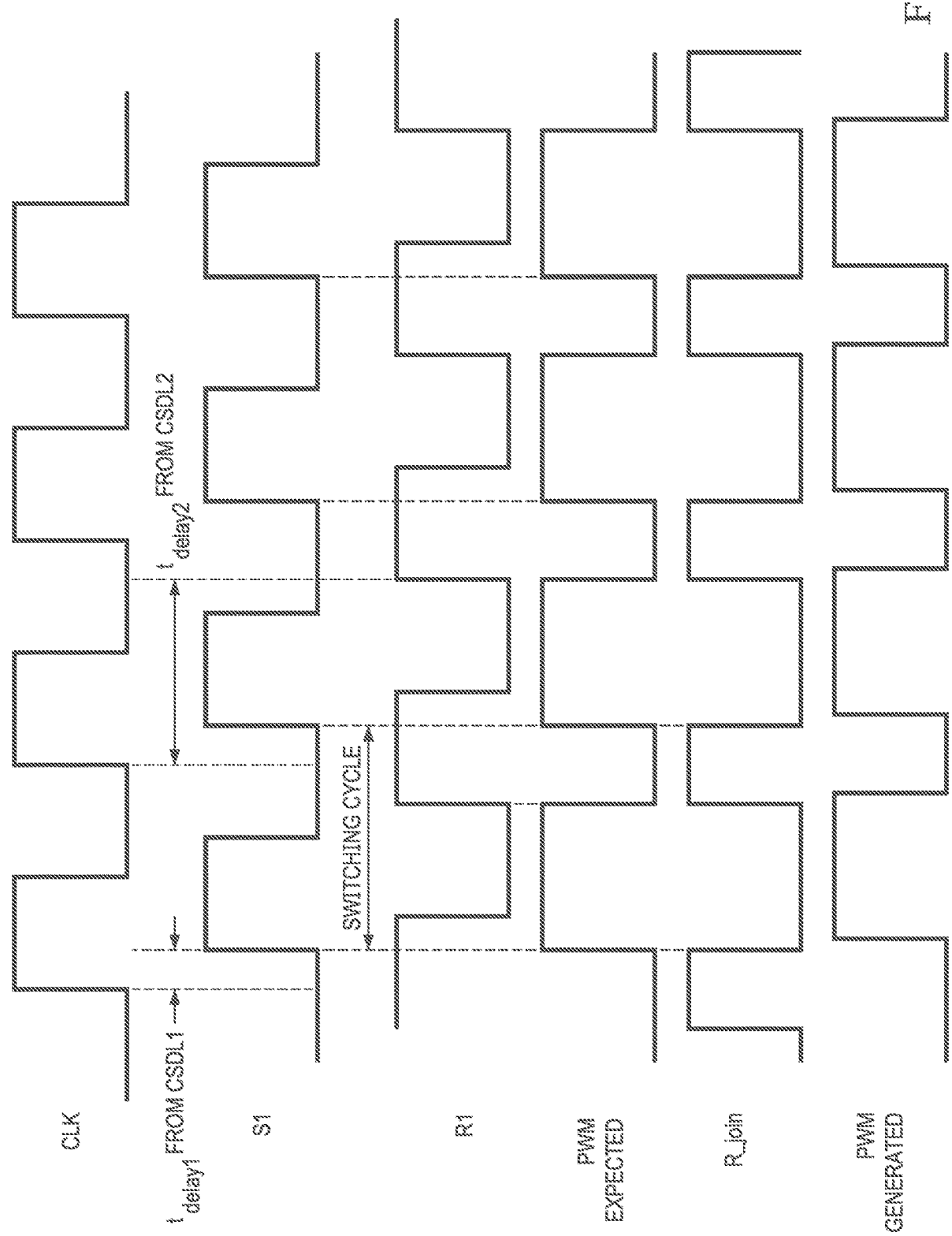
FIG. 17 illustrates a schematic signal waveform timing diagram of a combination of the circuits shown in FIGS. 1 and 15, according to specific example embodiments of this disclosure.

Referring to FIG. 17, depicted is a schematic signal waveform timing diagram of a combination of the circuits shown in FIGS. 1 and 15, according to specific example embodiments of this disclosure. FIG. 17 shows the manipulated reset signal "R_join" for RS flip-flop 120 in FIG. 1 and the generated PWM signal. As shown in FIG. 17, there is no logic high '1' level overlaps between R_join and S1 signal. R_join becomes high at the time when the R1 positive edge appears and becomes low at the end of each switching cycle after the D flip-flop reset signal becomes logic low '0'. The generated PWM signal is exactly the expected PWM signal.

Figure 18:
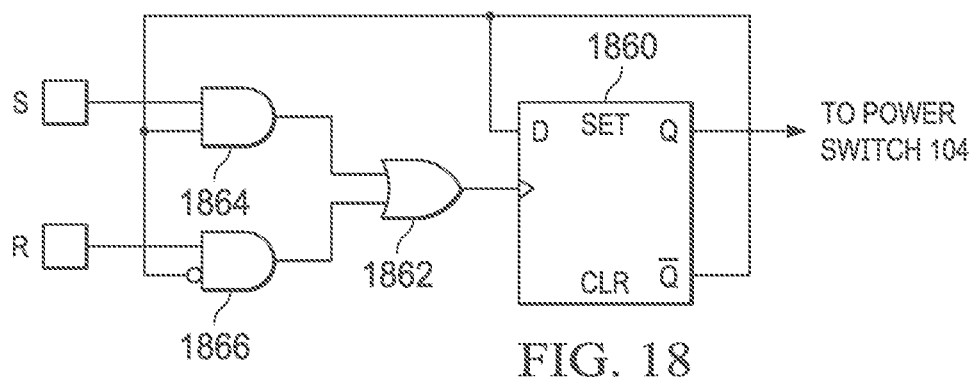
FIG. 18 illustrates a schematic diagram of another circuit for solving triggering issues when PWM duty cycles are larger than 50 percent, according to specific example embodiments of this disclosure.

Referring to FIG. 18, depicted is a schematic diagram of another circuit for solving triggering issues when PWM duty cycles are larger than 50 percent, according to specific example embodiments of this disclosure. FIG. 18 shows a RS flip-flop replacement circuit comprising a D-flip-flop 1860, an OR gate 1862, and two AND gates 1864 and 1866.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A method for controlling a DC-DC converter with a constant frequency pulse width modulation (PWM) controller, said method comprising the steps of:

delaying a clock signal by a fixed time with a first current starved delay line (CSDL), the first CSDL having a digital input coupled to a clock signal and a current input couple to a first current source for controlling delay time therethrough, the clock signal having a frequency, wherein the first CSDL provides a first delayed clock signal;

delaying the clock signal by a variable time with a second CSDL, the second CSDL having a digital input coupled to the clock signal and a current input coupled to a second current source for controlling delay time therethrough, the second CSDL having an adjustable time delay, wherein the second CSDL provides a second delayed clock signal, and the variable time of the second delayed clock signal is greater than the fixe time of the first delayed clock signal;

providing a power switch controller for coupling to and controlling a power switch of the DC-DC converter, wherein the power switch controller has a first input coupled to the first delayed clock signal and a second input coupled to the second delayed clock signal; and providing an error amplifier having a first input coupled to an output voltage of the DC-DC converter, a second input coupled to a reference voltage, and an output for controlling the variable time of the second CSDL, wherein a greater difference between the output voltage and the reference voltage will produce a longer variable time of the second CSDL, whereby the power switch will remain on for a longer time responsive to the greater difference between the output voltage and the reference voltage.

2. The method according to claim 1, further comprising the steps of:

providing a first RS flip-flop having a set input coupled to the output of the first CSDL, a reset input coupled to the output of the second CSDL, and an output coupled to and controlling the power switch of the DC-DC converter;

providing a power inductor coupled to the power switch of the DC-DC converter;

providing a capacitor coupled to the power inductor and adapted to supply the output voltage of the DC-DC converter;

coupling an output of the error amplifier to a voltage-to-current converter, wherein the current output from the voltage-to-current converter is coupled to the current input of the second CSDL, whereby the greater difference between the output voltage and the reference voltage will produce a larger current output from the voltage-to-current converter and thereby produce the longer variable time of the second CSDL so that the output of the first RS flip-flop turns on the power switch of the DC-DC converter for the longer time responsive to the greater difference between the output voltage and the reference voltage.

3. A constant frequency pulse width modulation (PWM) controller adapted for controlling a DC-DC converter, comprising:

a first current starved delay (CSDL) having a digital input coupled to a clock signal having a frequency and a current input coupled to a first current source for controlling delay time therethrough, wherein the first CSDL having a fixed time delay, wherein the first CSDL provides a first delayed clock signal;

a second CSDL having a digital input coupled to the clock signal and a current input coupled to a second current source for controlling delay time therethrough wherein the second CSDL having a variable time delay, wherein the second CSDL provides a second delayed clock signal, and a time delay of the second delayed clock signal is greater than a time delay of the first delayed clock signal;

a power switch controller for coupling to and controlling a power switch of sin DC-DC converter, wherein the power switch controller has a first input coupled to the first delayed clock signal and a second input coupled to the second delayed clock signal; and an error amplifier having a first input coupled to an output voltage of the DC-DC converter, a second input coupled to a reference voltage, and an output for controlling the time delay of the second delayed clock signal from the second CSDL, wherein a greater difference between the output voltage of the DC-DC converter and the reference voltage will produce a longer time delay of the second delayed clock signal, whereby the power switch of the DC-DC converter will remain on for a longer time responsive to the greater difference between the output voltage of the DC-DC converter and the reference voltage.

4. A constant frequency pulse width modulation (PWM) controller adapted for controlling a DC-DC converter, comprising:

a first RS flip-flop having a set input, a reset input and an output;

a first current starved delay line (CSDL) having an input coupled to a clock signal having a frequency, a current input, and an output coupled to the set input of the first RS flip-flop;

a first voltage-to-current converter having a current output coupled to the first CSDL current input and a voltage input coupled to a delay reference voltage;

a second CSDL having an input coupled to the clock signal, a current input, and an output coupled to the reset input of the first RS flip-flop;

a second voltage-to-current converter having a current output coupled to the second CSDL current input;

a first differential input amplifier having a first input coupled to a reference voltage, a second input for coupling to an output voltage of a DC-DC voltage converter, and an output coupled to a voltage input of the second voltage-to-current converter;

wherein the output of the first CSDL delays the clock signal by a fixed delay time determined by the delay reference voltage, and the output of the second CSDL delays the clock signal by a variable delay time determined by the output from the first differential input amplifier, and wherein the output from the first RS flip-flop controls a power switch of the DC-DC converter, whereby the power switch is closed when the output of the first CSDL is at a high logic level and the output of the second CSDL is at a low logic level, and open otherwise.

5. The constant frequency PWM controller according to claim 4, wherein the first input of the first differential input amplifier is a positive input, and the second input thereof is a negative input.

6. The constant frequency PWM controller according to claim 4, wherein the first differential input amplifier is an operational amplifier with a local feedback compensation network.

7. The constant frequency PWM controller according to claim 4, wherein the first differential input amplifier is an operational transconductance amplifier (OTA) with a current-to-voltage output compensation network.

8. The constant frequency PWM controller according to claim 4, further comprising:

an AND gate having an output and a first input coupled between the reset input of the first RS flip-flop and the output of the second CSDL, respectively, and a second input for coupling to a minimum ON time circuit;

wherein the reset input of the first RS flip-flop remains at the low logic level when the second input of the AND gate is at the low logic level.

9. The PWM controller according to claim 8, wherein the minimum ON time circuit comprises:
- a second RS flip-flop having a set input, a reset input and an output coupled to the second input of the AND gate;
- a third CSDL having an output coupled to the reset input of the second RS flip-flop, an input coupled to the clock signal, and a current input;
- a third voltage-to-current converter having a current output coupled to the third CSDL current input;
- a second differential input amplifier configured as an average calculator and having an output coupled to a voltage input of the third voltage-to-current converter, a first input coupled to a pulse frequency modulation (PFM) voltage reference, and a second input;
- a resistor coupled between the second input of the second differential input amplifier and a first output of the second flip-flop; and
- a capacitor coupled between the second input and the output of the second differential input amplifier;
- wherein the resistor and capacitor are configured to provide a minimum ON time of the power switch.

10. The constant frequency PWM controller according to claim 9, wherein the first input of the second differential input amplifier is a positive input, and the second input thereof is a negative input.

11. The constant frequency PWM controller according to claim 8, wherein the minimum ON time circuit comprises:
- a second RS flip-flop having a set input, a reset input and an output coupled to the second input of the AND gate;
- a third CSDL having a digital output coupled to the reset input of the second RS flip-flop, an input coupled to the clock signal and a current input; and
- a third voltage-to-current converter having a current output coupled to the third CSDL current input, and an input coupled to a predefined voltage comprising a delta voltage for determining a minimum ON time.

12. The constant frequency PWM controller according to claim 11, wherein the PFM voltage reference is equal to the first reference voltage plus a delta voltage to produce a desired delta delay through the third CSDL.

13. The constant frequency PWM DC-DC converter system according to claim 11, wherein the minimum ON time circuit comprises:
- a second RS flip-flop having an output coupled to the second input of the AND gate, a set input and a reset input;
- a third CSDL having a digital output coupled to a reset input of the second RS flip-flop, an input coupled to the clock signal, and a current input;
- a third voltage-to-current converter having a current output coupled to the third CSDL current input;
- a second differential input amplifier configured as an average calculator and having an output coupled to a voltage input of the third voltage-to-current converter, a first input coupled to a pulse frequency modulation (PFM) voltage reference, and a second input;
- a resistor coupled between the second input of the second differential input amplifier and a first output of the second RS flip-flop; and
- a capacitor coupled between the second input and the output of the second differential input amplifier;
- wherein the resistor and capacitor are configured to provide a minimum ON time of the power switch.

14. A constant frequency pulse width modulation (PWM) DC-DC converter system, said system comprising:
- a power switch coupled to a positive node of a voltage source;
- a power diode coupled to the power switch and a negative node of the voltage source;
- a power inductor coupled to the power switch;
- a capacitor coupled to the power inductor and the negative node of the voltage source;
- a load coupled to the capacitor and the negative node of the voltage source, whereby a DC output from the DC-DC converter system is provided;
- a PWM controller comprising:
  - a first RS flip-flop having a set input, a reset input and an output coupled to and controlling the power switch;
  - a first current starved delay line (CSDL) having an input coupled to a clock signal having a frequency, a current input, and a digital output coupled to the set input of the first RS flip-flop;
  - a second CSDL having an input coupled to the clock signal, a current input, and a digital output coupled to the reset input of the first RS flip-flop;
  - a first voltage-to-current converter having a current output coupled to the first CSDL current input and a voltage input coupled to a first reference voltage;
  - a second voltage-to-current converter having a current output coupled to the second CSDL current input;
  - a first differential input amplifier having a first input coupled to a second reference voltage, a second input coupled to the DC output of the DC-DC converter system, and an output coupled to a voltage input of the second voltage-to-current converter;
  - wherein the digital output of the first CSDL delays the clock signal by a fixed delay time determined by the first reference voltage, and the digital output of the second CSDL delays the clock signal by a variable delay time determined by the output voltage from the first differential input amplifier;
  - whereby the power switch is closed when the output of the first CSDL is at a high logic level and the output of the second CSDL is at a low logic level, and open otherwise.

15. The constant frequency PWM DC-DC converter system according to claim 14, wherein the PWM controller further comprises:
- an AND gate having an output and a first input coupled between the reset input of the first RS flip-flop and the digital output of the second CSDL, respectively, and a second input adapted for coupling to a minimum ON time circuit;
- wherein the reset input of the RS flip-flop remains at the low logic level when the second input of the AND gate is at the low logic level.

16. The constant frequency PWM controller according to claim 15, wherein the minimum ON time circuit comprises:
- a second RS flip-flop having a set input, a reset input and an output coupled to the second input of the AND gate;
- a third CSDL having a output coupled to a reset input of the second RS flip-flop, an input coupled to the clock signal and a current input; and
- a third voltage-to-current converter having a current output coupled to the third CSDL current input, and an input coupled to a pulse frequency modulation (PFM) voltage reference.

17. The constant frequency PWM DC-DC converter system according to claim 16, wherein the PFM voltage reference is equal to the first reference voltage plus a delta voltage to produce a desired delta delay through the third CSDL.

18. The constant frequency PWM DC-DC converter system according to claim 14, wherein the PWM controller further comprises a high duty cycle reset circuit coupled between the reset input of the first RS flip-flop and the digital output of the second CSDL, wherein the high duty cycle reset circuit output goes to a logic high only on a level transition from a logic low to a logic high from the digital output of the second CSDL.

19. The constant frequency PWM DC-DC converter system according to claim 18, wherein the high duty cycle reset circuit comprises:
- a D-flip-flop having a clock input coupled to the digital output of the second CSDL, a reset input coupled to an output of an AND gate;
- a first input of the AND gate coupled to a first delay tap of the CSDL and a second input of the AND gate coupled to a second delay tap of the CSDL wherein the second delay tap has a longer time delay than the first delay tap; and
- an OR gate having a first input coupled to an output of the D-flip-flop, a second input coupled to the output of the AND gate, and an output coupled to the reset input of the first RS flip-flop.

20. The constant frequency PWM DC-DC converter system according to claim 14, wherein the first RS flip-flop comprises:
- a D flip-flop having a Q-output coupled to and controlling the power switch, and an inverted Q-output coupled to a D-input;
- an OR gate having an output coupled to a clock input of the D flip-flop;
- a first AND gate having an output coupled to a first input of the OR gate, a first input coupled to the output of the first CSDL, and a second input coupled to the inverted Q-output of the D flip-flop; and
- a second AND gate having an output coupled to a second input of the OR gate, a first input coupled to the output of the second CSDL, and a second input coupled to the Q-output of the D flip-flop;
- wherein the Q-output of the D flip-flop goes to a logic high only on a level transition from a logic low to a logic high from the digital output of the second CSDL.

* * * * *

UNITED STATES PATENT AND TRADEMARK OFFICE
CERTIFICATE OF CORRECTION

PATENT NO. : 11,356,019 B2  
APPLICATION NO. : 17/145944  
DATED : June 7, 2022  
INVENTOR(S) : Scott Dearborn et al.

Page 1 of 1

It is certified that error appears in the above-identified patent and that said Letters Patent is hereby corrected as shown below:

In the Claims

Claim 1,
(Column 14), Line 4 change "fixe" to --fixed--

Claim 3,
(Column 15), Line 49 add "line" before "(CSDL)"
(Column 15), Line 64 change "sin" to --the--

Signed and Sealed this
Ninth Day of August, 2022

Katherine Kelly Vidal
*Director of the United States Patent and Trademark Office*